(12) United States Patent  
Donnelly et al.

(10) Patent No.: US 7,039,147 B2
(45) Date of Patent: May 2, 2006

(54) DELAY LOCKED LOOP CIRCUITRY FOR CLOCK DELAY ADJUSTMENT

(75) Inventors: Kevin S. Donnelly, San Francisco, CA (US); Pak Shing Chau, San Jose, CA (US); Mark A. Horowitz, Palo Alto, CA (US); Thomas H. Lee, Cupertino, CA (US); Mark G. Johnson, Los Altos, CA (US); Benedict C. Lau, San Jose, CA (US); Leung Yu, Santa Clara, CA (US); Bruno W. Garlepp, Mountain View, CA (US); Yiu-Fai Chan, Los Altos Hills, CA (US); Jun Kim, Redwood City, CA (US); Chanh Vi Tran, San Jose, CA (US); Donald C. Stark, Palo Alto, CA (US); Nhat M. Nguyen, San Jose, CA (US)

(73) Assignee: Rambus Inc., Los Altos, CA (US)

( * ) Notice: Subject to any disclaimer, the term of this patent is extended or adjusted under 35 U.S.C. 154(b) by 0 days.

(21) Appl. No.: 10/366,865

(22) Filed: Feb. 14, 2003

(65) Prior Publication Data

US 2004/0223571 A1 Nov. 11, 2004

Related U.S. Application Data

(63) Continuation of application No. 09/524,402, filed on Mar. 13, 2000, now Pat. No. 6,539,072, which is a continuation of application No. 08/795,657, filed on Feb. 6, 1997, now Pat. No. 6,125,157.

(51) Int. Cl.
*H03D 3/24* (2006.01)

(52) U.S. Cl. .................................... 375/373

(58) Field of Classification Search ............... 375/354, 375/358, 371, 373, 375, 376; 327/5, 141, 327/163, 261, 276, 149, 156, 158, 161; 331/14, 331/17, 25

See application file for complete search history.

(56) References Cited

U.S. PATENT DOCUMENTS 4,338,569 A 7/1982 Petrich ........................ 327/158

(Continued)

FOREIGN PATENT DOCUMENTS

EP 0 116 669 8/1984

(Continued)

OTHER PUBLICATIONS

Lee et al., "A 2.5 V CMOS Delay-Locked Loop for an 18 Mbit, 500 Megabyte/s DRAM", *IEEE Journal of Solid-State Circuits*, 29(12):1491-1496 (1994).

(Continued)

*Primary Examiner*—Kevin Kim
(74) *Attorney, Agent, or Firm*—Morgan, Lewis & Bockius LLP

(57) ABSTRACT

Delay locked loop circuitry for generating a predetermined phase relationship between a pair of clocks. A first delay-locked loop includes a delay elements arranged in a chain, the chain receiving an input clock and generating, from each delay element, a set of phase vectors, each shifted a unit delay from the adjacent vector. The first delay-locked loop adjusts the unit delays in the delay chain using a delay adjustment signal so that the phase vectors span a predetermined phase shift of the input clock. A second delay-locked loop selects, from the first delay-locked loop, a pair of phase vectors which brackets the phase of an input clock. A phase interpolator receives the selected pair of vectors and generates an output clock and a delayed output clock, the amount of the delay being controlled by the delay adjustment signal of the first delay-locked loop circuitry. A phase detector compares the delayed output clock with the input clock and adjusts the phase interpolator, based on the phase comparison, so that the phase of the delayed output clock is in phase with the input clock. As a result, there is a predetermined phase relationship between the output clock and the input clock, the phase relationship being the amount of delay between the output clock and the delayed output clock. Different phase relationships between the input and output clock are possible depending on the number of unit delays used in the path of the, delayed output clock or the output clock.

62 Claims, 19 Drawing Sheets

U.S. PATENT DOCUMENTS

| | | | | |
|---|---|---|---|---|
| 4,447,675 A | * | 5/1984 | Arntsen et al. | 455/401 |
| 4,618,788 A | | 10/1986 | Backes et al. | 327/277 |
| 4,833,695 A | | 5/1989 | Greub | 375/271 |
| 4,884,041 A | | 11/1989 | Walker | 331/57 |
| 5,126,691 A | * | 6/1992 | Mijuskovic et al. | 331/1 A |
| 5,180,994 A | | 1/1993 | Martin et al. | 331/38 |
| 5,216,302 A | | 6/1993 | Tanizawa | 327/157 |
| 5,399,995 A | | 3/1995 | Kardontchik et al. | 331/17 |
| 5,412,697 A | * | 5/1995 | Van Brunt et al. | 375/360 |
| 5,451,894 A | | 9/1995 | Guo | 327/241 |
| 5,485,490 A | | 1/1996 | Leung et al. | 375/371 |
| 5,513,327 A | | 4/1996 | Farmwald et al. | 710/305 |
| 5,532,633 A | | 7/1996 | Kawai | 327/174 |
| 5,534,805 A | | 7/1996 | Miyazaki et al. | 327/144 |
| 5,550,783 A | | 8/1996 | Stephens, Jr. et al. | 365/233 |
| 5,570,054 A | | 10/1996 | Takla | 327/292 |
| 5,600,678 A | * | 2/1997 | Petranovich et al. | 375/298 |
| 5,614,855 A | | 3/1997 | Lee et al. | 327/158 |
| 5,619,541 A | | 4/1997 | Van Brunt et al. | 375/360 |
| 5,633,608 A | | 5/1997 | Danger | 327/270 |
| 5,661,419 A | * | 8/1997 | Bhagwan | 327/8 |
| 5,677,644 A | * | 10/1997 | Silverbrook et al. | 327/131 |
| 5,712,883 A | | 1/1998 | Miller et al. | 375/371 |
| 5,712,884 A | | 1/1998 | Jeong | 375/375 |
| 5,719,515 A | | 2/1998 | Danger | 327/270 |
| 5,727,037 A | * | 3/1998 | Maneatis | 375/376 |
| 5,764,092 A | | 6/1998 | Wada et al. | 327/271 |
| 5,789,958 A | * | 8/1998 | Chapman et al. | 327/261 |
| 5,799,051 A | | 8/1998 | Leung et al. | 375/376 |
| 5,881,295 A | * | 3/1999 | Iwata | 710/262 |
| 6,125,157 A | | 9/2000 | Donnelly et al. | 375/371 |
| 6,282,253 B1 | | 8/2001 | Fahrenbruch | 375/371 |
| 6,539,072 B1 | | 3/2003 | Donnelly et al. | 375/371 |

FOREIGN PATENT DOCUMENTS

| | | |
|---|---|---|
| EP | 0 306 662 | 3/1989 |
| EP | 0 645 888 | 3/1995 |
| WO | WO 95/22206 | 8/1995 |
| WO | WO 96/03808 | 2/1996 |

OTHER PUBLICATIONS

Tanoi et al., "A 250-622 MHz Deskew and Jitter-Suppressed Clock Buffer Using Two-Loop Architecture", *IEEE Journal of Solid-State Circuits*, 31(4):487-493 (1996).

Supplementary European Search Report, dated Feb. 18, 2003, issued in co-pending European Application No. EP 98 90 6112.

* cited by examiner

DELAY LOCKED LOOP CIRCUITRY FOR CLOCK DELAY ADJUSTMENT

This application is a continuation of patent application Ser. No. 09/524,402, filed Mar. 13, 2000, now U.S. Pat. No. 6,539,072 which was a continuation of patent application Ser. No. 08/795,657, filed Feb. 6, 1997, which issued as U.S. Pat. No. 6,125,157 on Sep. 26, 2000.

BACKGROUND OF THE INVENTION

The present invention relates to clock delay adjustment circuitry. In particular, the present invention relates to the generation of a set of phase vectors and the generation of output clocks that have precise phase relationships to an input clock.

Previous art includes Rambus patent, U.S. Pat. No. 5,485,490, Leung and Horowitz, which discloses two independent loops, the first of which creates a fixed number of phase vectors, the second of which creates an output clock that is in phase with the input clock. Also disclosed in this patent is the use of separate circuitry to create a leading phase clock to the output clock by selecting a pair of phase vectors and interpolating between them to produce an output that leads the output clock by the delay between phase vectors available from the first loop.

IEEE Journal of Solid-State Circuits, Vol. 29, No. 12, December 1994, Lee, et. al. ("Lee") discloses a pair of delay-locked loops (DLL) for transmitting and receiving data in DRAMs. IEEE Journal of Solid-State Circuits, Vol. 31, No. 4, April 1996, Tanoi et al. shows a two-loop architecture in which a frequency locked-loop (FLL) is designed to lock onto an external input frequency and to control the DLL for lock-in to the phase of the external input clock.

It is desirable to improve on the generation of a leading output clock to the in phase output clock. There are several drawbacks to the invention disclosed in U.S. Pat. No. 5,485,490. Phase locked loop circuitry employing a VCO and single order loop filter to create phase vectors is a second order system. This second order system has stability problems associated with its operation. Furthermore, the VCO phase lock loop accumulates phase error in response to sudden change in phase on inputs to the loop, where the input includes not only the input clock but also the power supplies to the loop. This occurs because the loop changes the frequency of the VCO in response to a sudden phase change and this frequency shift is integrated to become phase error which persists for a time on the order of the reciprocal loop bandwidth. (See Lee, above). This causes the loop to be noise sensitive when the noise is in the form of sudden phase shifts. Another drawback regarding the prior art patent is that the subloop used for generating the in-phase clock relies on the accuracy and similarity of a second phase interpolator (out-of-phase phase interpolator) to produce the leading clock. Any lack of matching between the out-of-phase phase interpolator and the in-phase phase interpolator will create a phase error in the desired phase relationship between the leading clock and the in-phase clock. Another drawback concerns the acquisition time of the VCO which can be quite long after restoration of a lost input clock, depending on how long the input clock has been absent.

SUMMARY OF THE INVENTION

The present invention provides delay locked loop circuitry for generating a predetermined phase relationship between a pair of clocks. A first delay-locked loop (DLL) includes delay elements arranged in a chain, the chain receiving an input clock and generating, from the delay elements, a set of phase vectors, each shifted a unit delay from the adjacent vector. The first delay-locked loop adjusts the unit delays in the delay chain using a delay adjustment signal so that the phase vectors span a predetermined phase shift of the input clock.

In a preferred embodiment, a second DLL is used, although the second DLL could be used with another circuit which produces two different delayed clock signals. The second DLL selects, from the first DLL, a pair of phase vectors which brackets the phase of an input clock. A phase interpolator receives the selected pair of vectors and generates an output clock and a delayed output clock, the amount of the delay being controlled by the delay adjustment signal of the first delay-locked loop circuitry.

Preferably, a phase detector in the second DLL compares the delayed output clock with the input clock and adjusts the phase interpolator, based on the phase comparison, so that the phase of the delayed output clock is in phase with the input clock. The phase interpolator is preferably adjusted with a control circuit including a digital memory for storing a count corresponding to the delay adjustment, which can be maintained in the absence of the input clock signal.

Preferably, the first DLL includes a control circuit with a digital memory for providing the desired delay adjustment to the adjustable delay elements. A filter is used between the phase detector and the control circuit to reduce loop jitter.

The present invention is advantageously used for the transmit and receive clocks in high speed DRAM and a high speed DRAM bus channel.

Other objects, features, and advantages of the present invention will be apparent from the accompanying drawings and from the detailed description which follows below.

BRIEF DESCRIPTION OF THE DRAWINGS

The features and advantages of the present invention are illustrated by way of example and are by no means intended to limit the scope of the present invention to the particular embodiments shown, and in which:

FIG. 19A is the amplifier in which the duty cycle is corrected and FIG. 193 is the duty cycle error detecting circuit which applies a correction signal to the amplifier in FIG. 19A.

DESCRIPTION OF THE PREFERRED EMBODIMENT

Embodiments of the present invention provide a method and circuitry to generate a set of phase vectors in a way that is more immune to noise on loop inputs including the power supplies, leading to a more stable set of phase vectors. Also, an output clock that has a predetermined phase relationship with an input clock is provided. The effect of clock buffer delays between the input clock and output clock is minimized. The delay of an adjustable delay element is adjusted with a counter and a digital to analog converter, the count in the counter digitally representing the current delay adjustment of the delay locked loop. The digital count is converted to a signal suitable for adjusting an adjustable delay element used in a delay locked loop.

The setting of current delay adjustment of the loop is digitally represented so that the setting may be stored while the loop is in a powered-down or low power state. There is quick re-acquisition of the locked state of a delay locked loop after the delay locked loop has been powered down.

Figure 1:
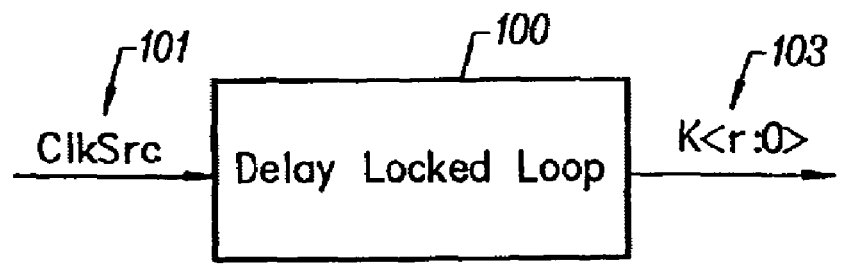
FIG. 1 shows a block diagram of a delay locked loop for generating phase vectors, K<r:0>.
Figure 12:
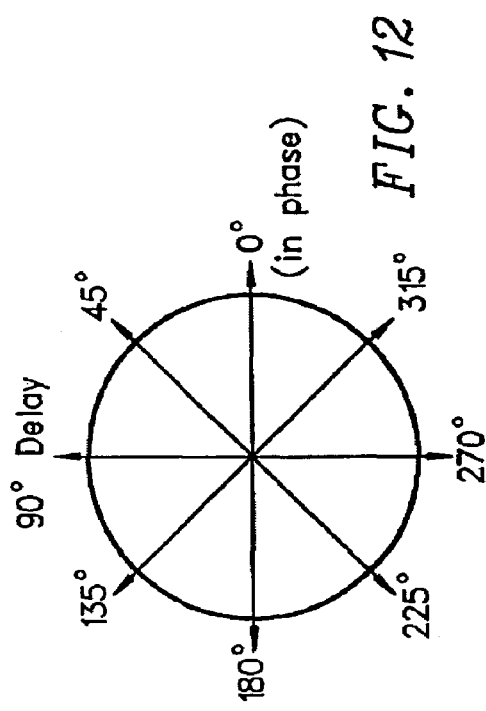
FIG. 12 shows a set of eight phase vectors each separated by a 45 degree interval and spanning 360 degrees shift of the 0 degree vector.
Figure 11:
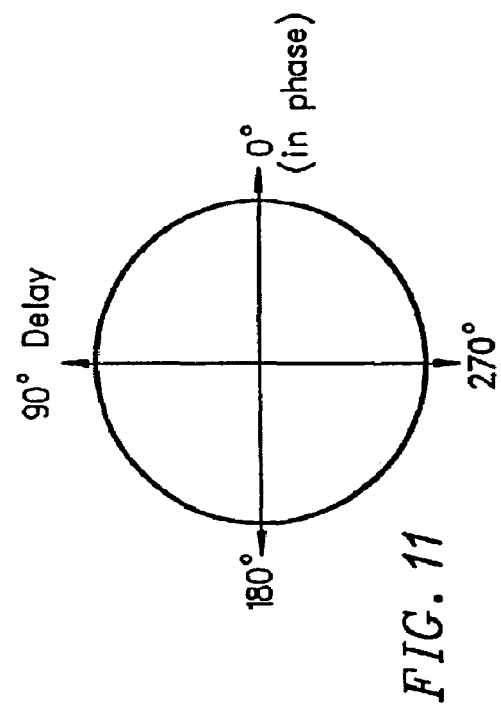
FIG. 11 shows a set of four phase vectors each separated by a 90 degree interval and spanning 360 degrees shift of the 0 degree vector.
Figure 13:
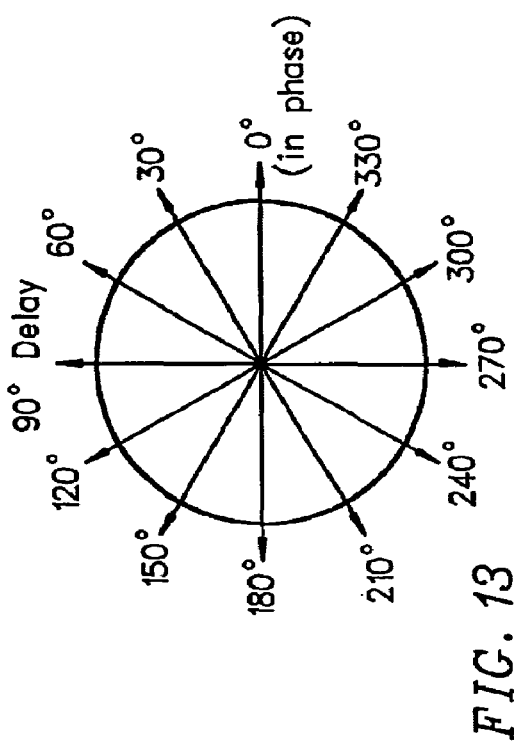
FIG. 13 shows a set of 12 phase vectors each separated by a 30 degree interval and spanning 360 degrees shift of the 0 degree vector.

In one embodiment of the present invention a delay locked loop (DLL) is employed for generating phase vectors. Referring to FIG. 1, the DLL 100 receives an external clock, ClkSrc 101, and generates phase vectors, K<r:0> 103. A convenient way to represent the set of phase vectors for a periodic signal is to draw the vectors in phase space as in FIG. 11. In this figure there are four vectors each spaced apart by 90 degrees and spanning a 360 degree phase shift of the 0 degree vector. Each vector in this figure represents a time delay of one fourth of the cycle of the periodic signal. FIGS. 12 and 13 show alternate sets of phase vectors. FIG. 12 shows a set of vectors spaced at 45 degree intervals and spanning a 360 degree phase shift of the 0 degree vector. FIG. 13 shows a set of vectors spaced at 30 degree intervals and spanning s 360 degree phase shift of the 0 degree vector.

Figure 2:
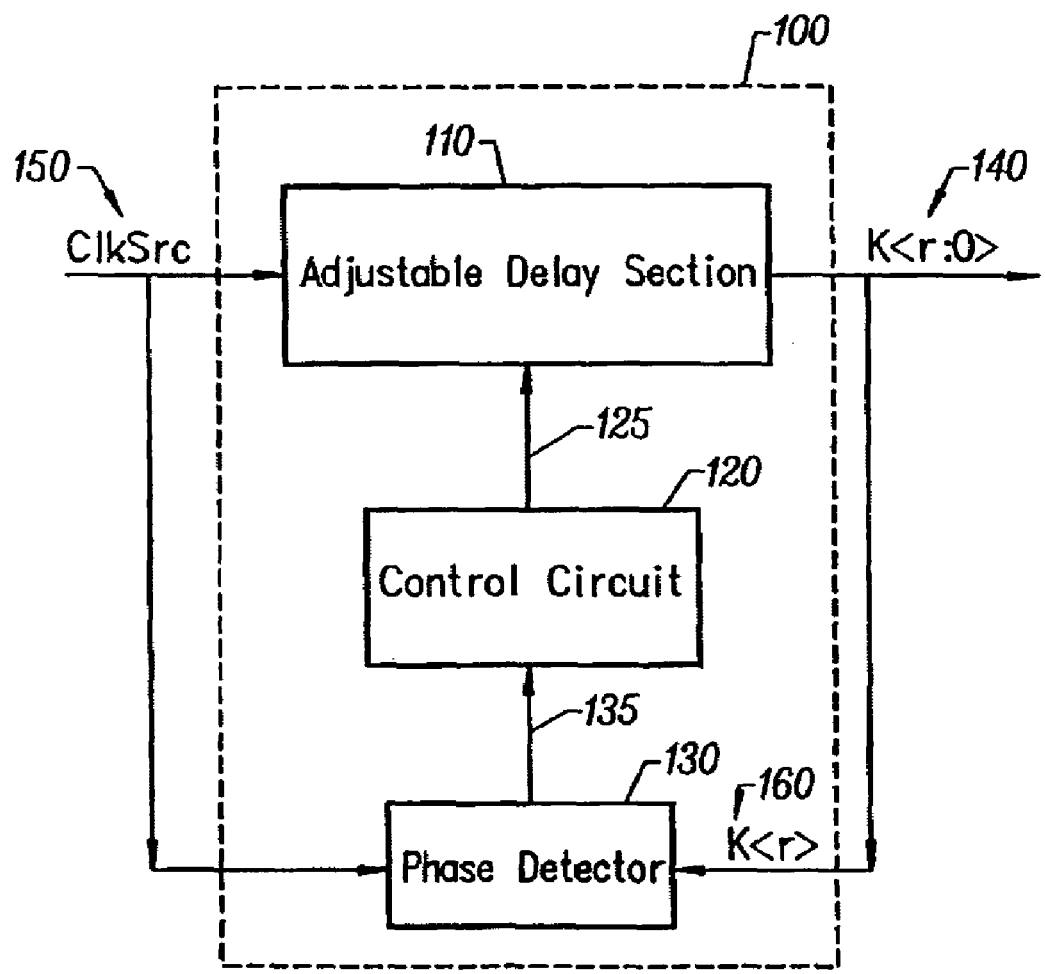
FIG. 2 shows a more detailed block diagram than FIG. 1 of a delayed locked loop for generating phase vectors, K<r:0>, according to one embodiment.

Referring to the embodiment shown in FIG. 2, the DLL 100 is a first order loop comprising a set of adjustable delay section 110, a control circuit 120 and a phase detector 130. The phase detector 130 receives the external clock, ClkSrc 150 from which it derives a clock input ClkIn (not shown), a set of phase vector lines 140 and the last phase vector K<r> on line 160. The output of phase detector 130 is coupled to the control circuit 120 which processes the output of the phase detector to generate a delay adjust signal 125 for adjusting the delay of the delay elements. The adjustable delay elements are adjusted so that the phase of K<r> is the same as the clock input, ClkIn.

Figure 3:
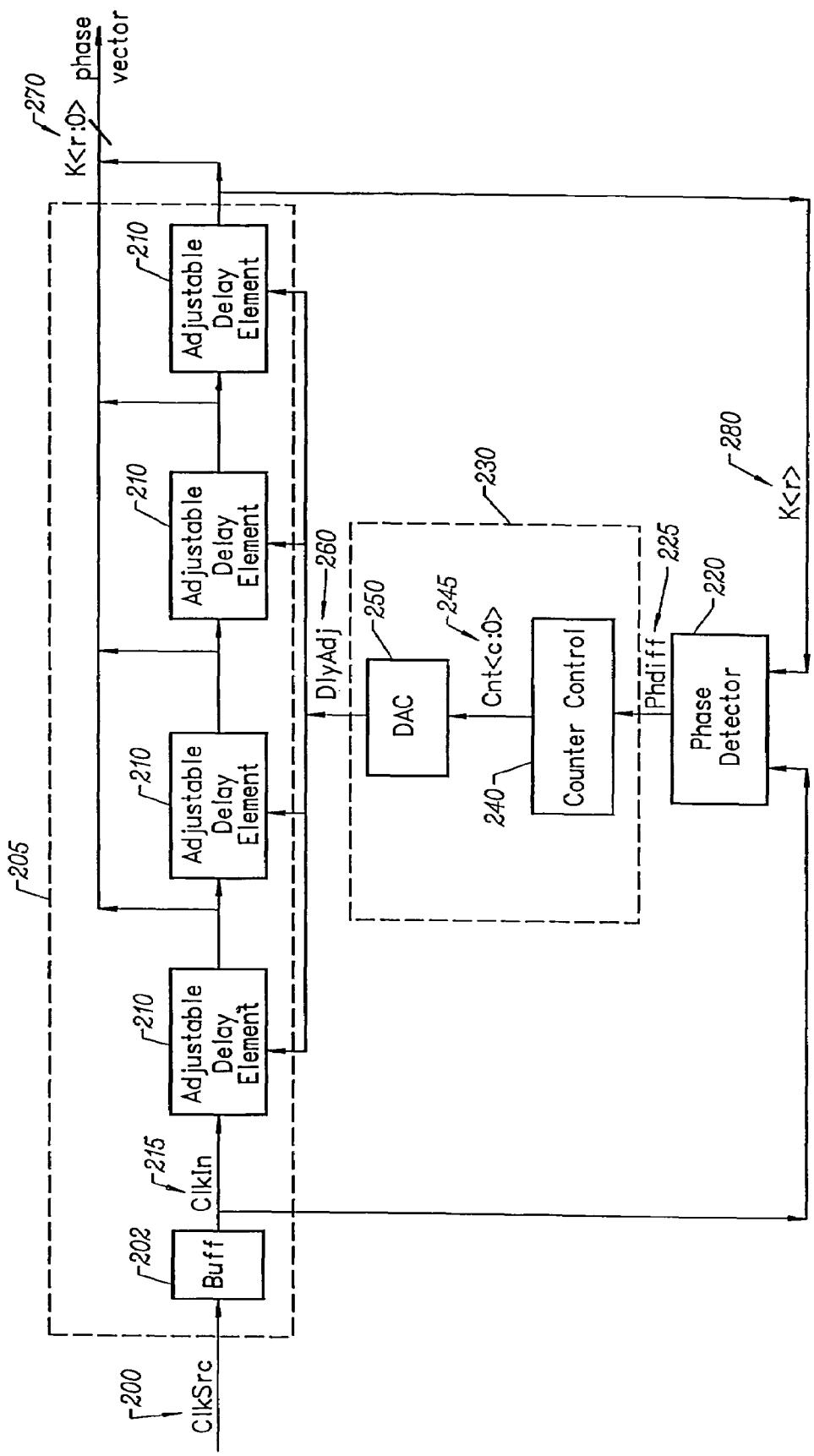
FIG. 3 shows a more detailed architecture than FIG. 2 of a delayed locked loop for generating phase vectors, K<r:0>, according to one embodiment.

FIG. 3 shows an embodiment of the DLL in more detail. In particular, adjustable delay section 205 comprise a set of four identical adjustable delay elements 210 connected in series with the output of each delay element 210 except the last element connected to the input of the next element 210. While four delay elements are shown in the particular embodiment, any number such as two, three, four, six, eight or twelve, can be used. This arrangement produces a set of clocks, called phase vectors K<r:0> 270, each shifted in time from the next by a delay, called a unit delay, generated by the adjustable delay section 205. Each adjustable delay element 210 receives the delay adjust signal DlyAdj 260 from control circuit 230, comprising counter control circuit 240 and digital to analog converter (DAC) 250. Counter control circuit 240 receives an input, PhDiff 225, from phase detector 220 and generates count Cnt<c:0> 245 for input to the DAC. In one embodiment, control circuit 230 is implemented with digital circuits to permit the storage of the current delay adjustment setting of the loop, held by Cnt<c:0> 245, during times when the ClkSrc 200 is not present, perhaps during a period when the system is shut down to save power. The saved setting permits the loop to quickly re-acquire a locked condition when the ClkSrc is reactivated.

Continuing with FIG. 3, phase detector 220 receives as inputs ClkIn 215 derived from the ClkSrc 200 via buffer 202 and the last phase vector K<r> 280. In another embodiment, buffer 202 performs duty cycle correction as well as amplification to assure that ClkIn 215 has a 50% duty cycle. Duty cycle correction is discussed in greater detail below.

Figure 16A:
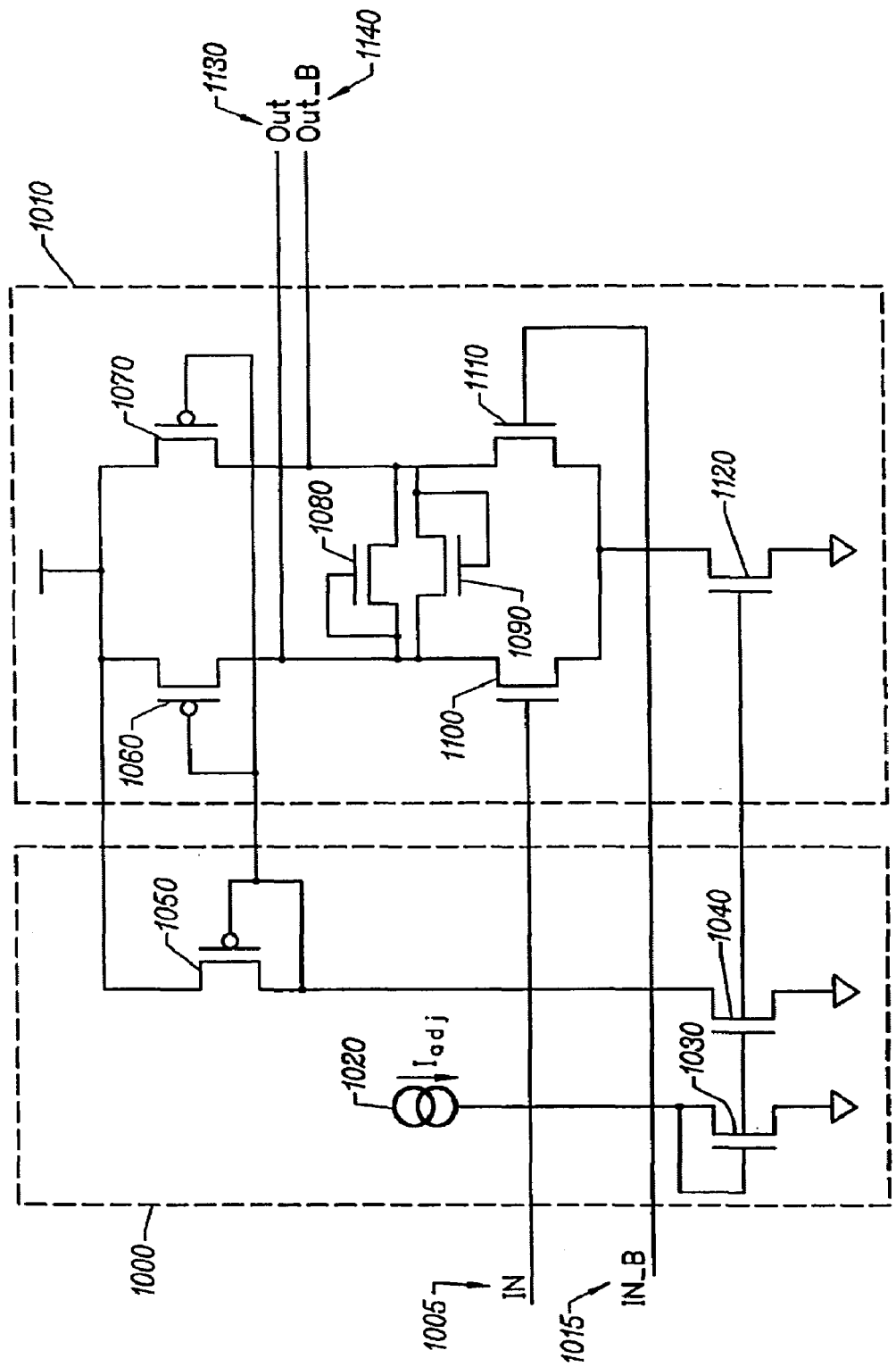
FIG. 16A shows an embodiment of a delay element for use in a delay locked loop.

In FIG. 3, adjustable delay element 210 may be implemented according to the embodiment shown in FIG. 16A, which shows a delay element 1010 and a bias circuit 1000. In FIG. 16A the delay element is a differential delay element, having both true and complementary inputs and outputs. The circuit operates to delay the differential inputs IN 1005 and IN_B 1015 to produce delayed outputs Out 1130 and Out_B 1140. The amount of delay is adjusted by adjustable current source 1020, which controls the amount of current switched by differential pair 1100 and 1110. The greater the amount of current switched the smaller delay produced by the differential pair. Transistors 1080 and 1090 act as clamps to limit the swing of the differential pair allowing small delays to be realized by the circuit.

Figure 16B:
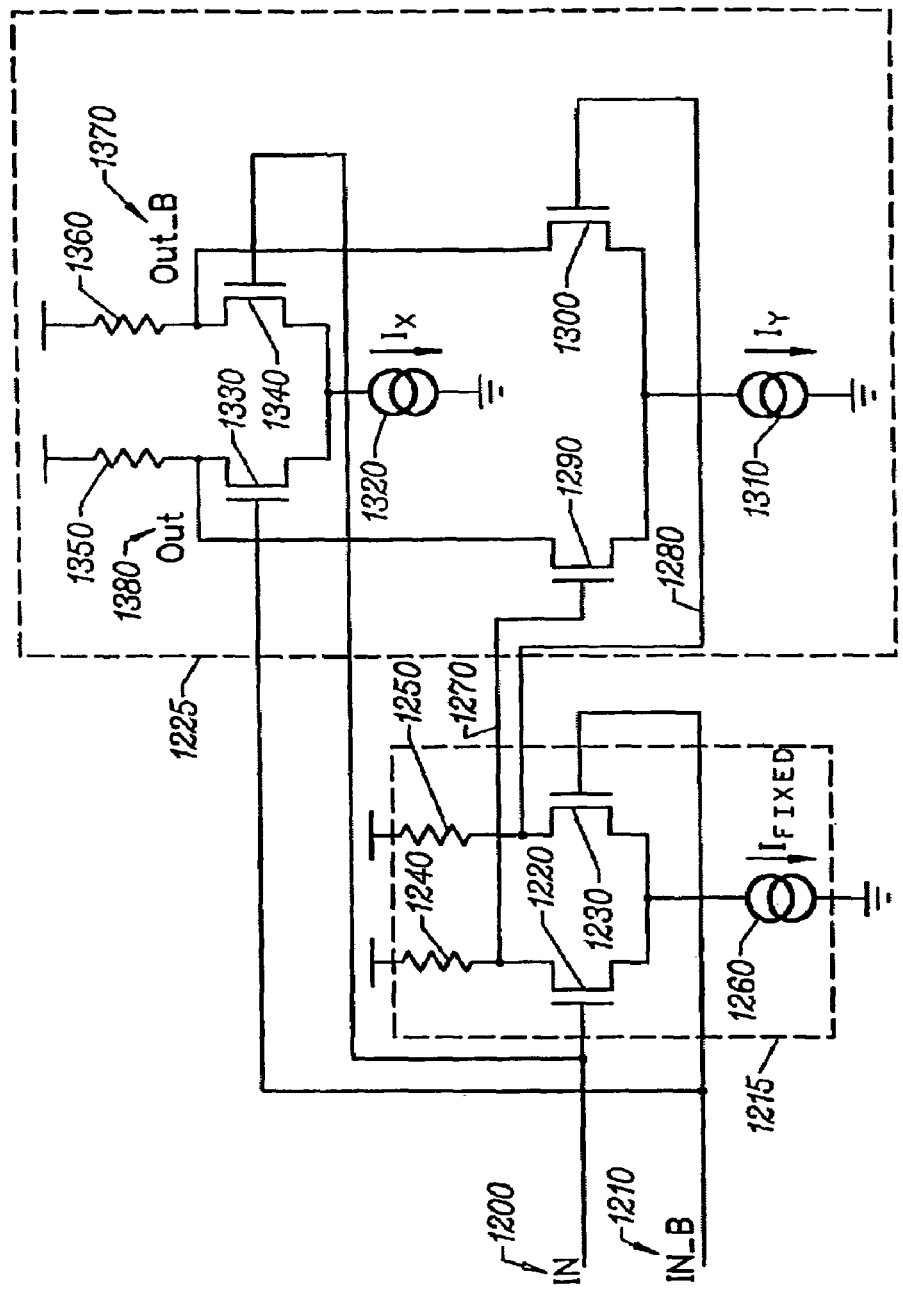
FIG. 16B shows another embodiment of a delay element for use in a delay locked loop.

The adjustable delay element may also be implemented according to the embodiment shown in FIG. 16B. In this figure section 1215 functions as a fixed delay comprising a current source 1260 and a differential pair 1220 and 1230, and section 1225 operates as a phase interpolator comprising differential pair 1330 and 1340 with current source 1320 and differential pair 1290 and 1300 with current source 1310 to produce a delay that is adjustable between a stage delay to a fixed delay plus the stage delay. The stage delay represents the fixed delay time through the interpolator stage 1225. The phase interpolator delay stage 1225 is adjusted by varying the current sources Ix 1320 and Iy 1310. If Ix is at maximum and Iy is turned off the output signals Out 1380 and Out_B 1370 are produced by transistors 1330 and 1340 in phase with the input signals but delayed by the stage delay. If Iy 1310 is maximum and Ix 1320 is off then the output signals Out 1380 and Out_B 1370 are produced by transistors 1290 and 1300 and are delayed by amount of the fixed delay provided by the 1215 section plus the stage delay. Therefore, the phase interpolator delay stage 1225 is adjustable through a range of delay equal to the fixed delay of the 1215 section.

Figure 17:
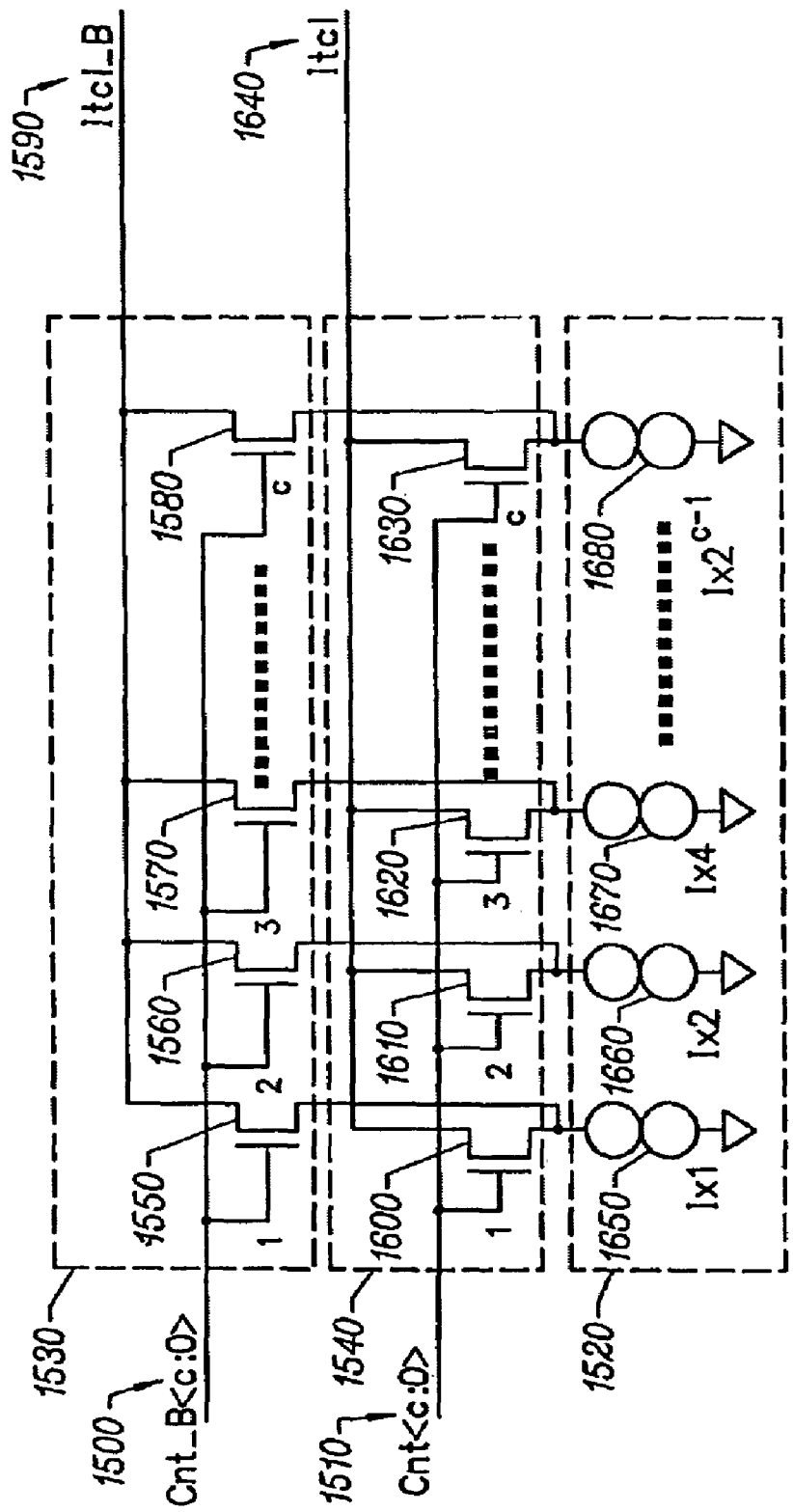
FIG. 17 shows an embodiment of a digital to analog converter for use in a delay locked loop.

FIG. 3 depicts a DAC which may be implemented according to the DAC shown in FIG. 17, which depicts a circuit for converting a digital count Cnt<c:0> 1510 and its complement Cnt_B<c:0> 1500 to a differential current pair, Ictl 1640 and Ictl_B 1590 proportional to the count. FIG. 17 shows three sections of circuitry, a set of binary weighted current sources 1520, a set of switches 1540 for producing the true current output Ictl 1640 and a set of switches 1530 for producing the complement output Ictl_B 1590. If the count input Cnt<c:0> 1510 is all ones then Ictl 1640 has a maximum current, Max_I, which is the sum of all of the current sources 1650, 1660, 1670 through 1680 and the complementary current Ictl_B is zero. If the count input Cnt<c:0> 1510 is all zeros then Ictl_B 1590 has the maximum current, Max I, and Ictl is zero. Intermediate counts produce intermediate amounts of current, Im, and (Max_I−Im) on Ictl and Ictl_B respectively. This DAC is suitable for controlling the differential input delay adjust signals of the adjustable delay element 210 shown in FIG. 16B for the delay locked loop shown in FIG. 3.

The system shown in FIG. 3 operates as follows. Phase detector 220 compares the ClkIn signal, with the last phase vector K<r> 280 to determine the phase difference from a predetermined phase relationship between the two clocks. In one embodiment the predetermined phase difference could be zero degrees. In another embodiment the predetermined phase difference could be 180 degrees. The phase difference is represented by signal PhDiff 225. Counter control block then converts the PhDiff signal into a digital count, Cnt<c:0> 245, and DAC 250 converts the count value into an analog quantity, DlyAdj 260, for adjusting the adjustable delay elements. In some embodiments the Cnt<c:0> signal and the DlyAdj signal may be differential signals. The delay adjustment operates to change the delay of the adjustable delay elements so that the phase difference from the predetermined phase relationship between clock input, ClkIn and K<r> is made close to zero. When this condition occurs the DLL is locked, and each adjustable delay element has substantially the same delay. Thus each phase vector is displaced in time from the adjacent vector by an amount equal to the setting of the adjustable delay element. This time displacement is termed a unit delay. The result is that the phase vectors span a 360 degree phase shift of the ClkIn signal 215. These phase vectors can now be used in another DLL to lock the phase of an output clock in precise phase relationship to the arbitrary phase of an input clock.

For FIG. 3, an alternate embodiment could use fewer delay elements to produce phase vectors that span the 360 degree phase shift of the ClkIn if each delay element, such as the ones depicted in FIGS. 16A and 16B, can produce both true and complementary outputs. For example, instead of using four delay elements each separated by 90 degrees, two delay elements separated by 90 degrees could be used if the delay element had true outputs yielding delays of 90 and 180 degrees and complementary outputs yielding 270 and 360 degrees, respectively. Alternatively, fewer delay elements could be used if the phase detector were designed to detect phase differences from a predetermined phase relationship of 180 degrees. Using such a phase detector would only require that two delay elements be used spanning a 180 degree phase shift of the ClkIn signal. The outputs of the delay elements could be inverted in a separate circuit which receives the phase vectors, so that a set of phase vectors spanning 360 degrees is obtained. For embodiments in which the phase shift of the ClkIn signal spans only 180 degrees buffer 202 may perform a duty cycle correction function to assure that the ClkIn signal 215 has a 50% duty cycle. This is especially important when the remaining span of 180 degrees is derived through inversion of the phase vectors spanning the first 180 degrees, because inversion will not generate the proper phase shift if the duty cycle is not substantially close to 50%.

Figure 4:
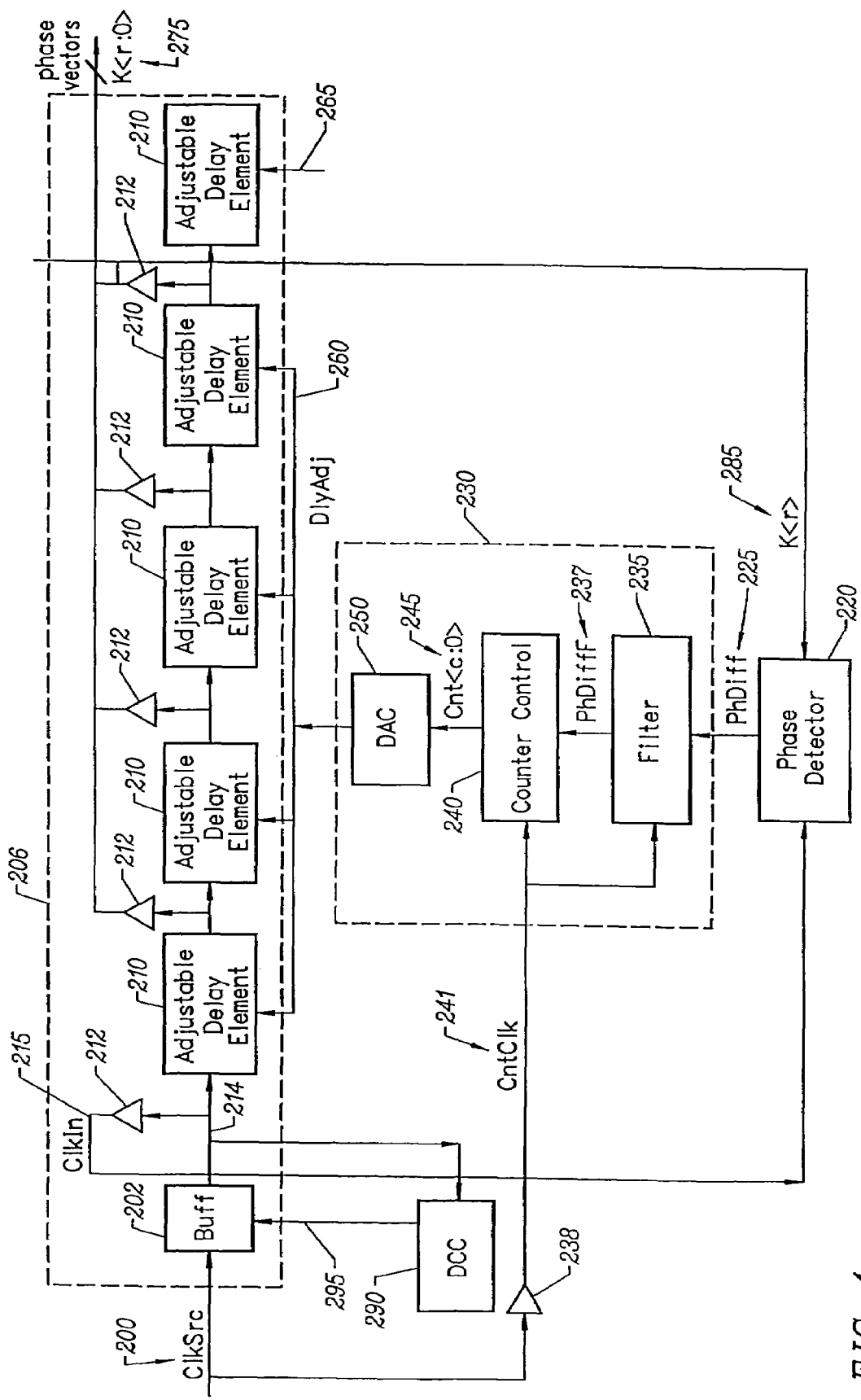
FIG. 4 shows another embodiment of a delay locked loop for generating phase vectors using buffered delay elements and a buffer clock source.

Referring the embodiment in FIG. 4, an additional adjustable delay element has been placed in the circuit to receive the last phase vector. This additional delay has the effect of insuring that each phase vector has the identical loading as the other phase vectors, so that phase errors caused by loading differences are substantially eliminated. Rather than connecting the delay adjust signal 265 to the DlyAdj signal 260, signal 265 may be connected to a convenient voltage, because the output of the additional delay is not used. This eliminates some of the loading on the DlyAdj signal 260.

Continuing with the embodiment of FIG. 4, phase vectors 275 are buffered by buffers 212 in order to further control the loading on the vectors by isolating the loading of the phase vectors from other circuits which may receive the vectors. A buffered version of ClkIn 215 and a buffered version of the last phase vector K<r> 285 are sent to the phase detector. This guarantees that buffered version of the phase vectors K<r:0> 275 are separated in phase by a unit delay and that the set of buffered phase vectors span a 360 degree or 180 degree shift of the buffered ClkIn signal depending upon the embodiment chosen.

Also shown in FIG. 4 is a version of buffer 202 which has a duty cycle correcting circuit 290 attached. The duty cycle correcting circuit 290 senses signal 214 for a deviation from a 50% duty cycle. It then feeds a correction signal to buffer 202 to correct signal 214. In some embodiments signal 214 is a differential signal and the error signal 295 is a differential signal.

Figure 19A:
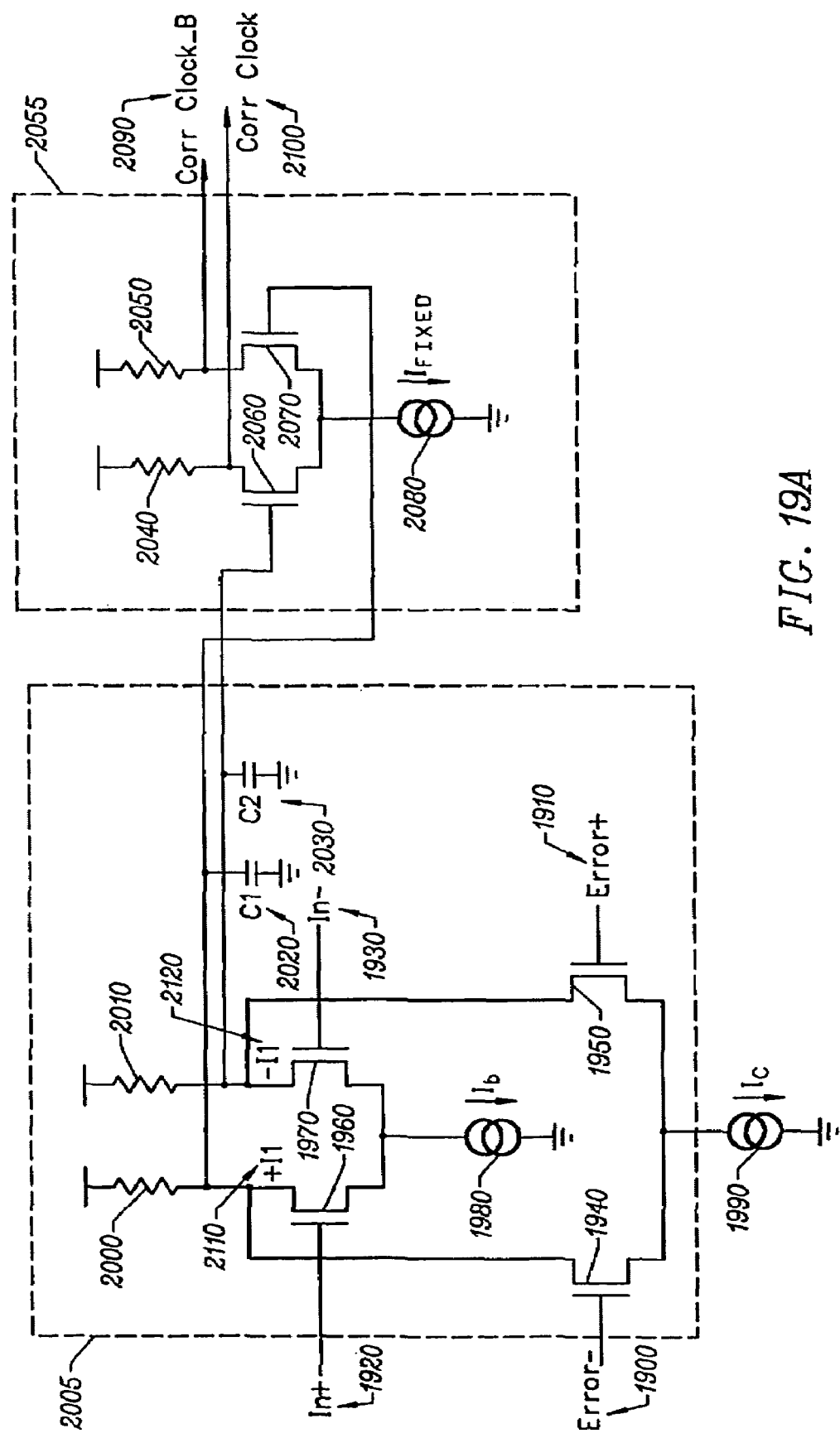
FIGS. 19A and 19B show an embodiment of a duty cycle correcting amplifier for use in a delay locked loop.
Figure 19B:
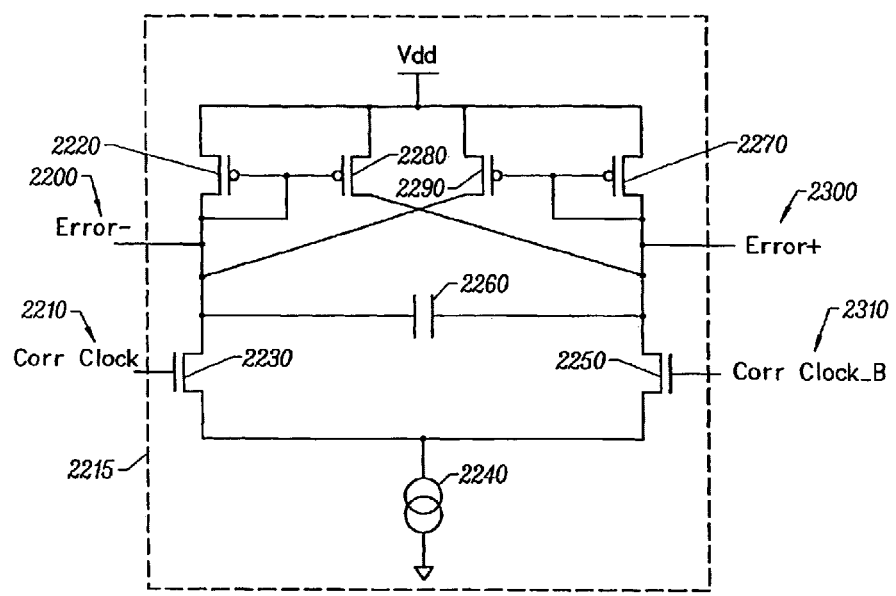

An embodiment of a duty cycle correcting amplifier is shown in FIGS. 19A and 19B. FIG. 19A shows the correcting stage 2005 and the buffering stage 2055 and FIG. 19B shows the duty cycle error detecting stage 2215. In FIG. 19A differential pair 1960 and 1970 receive the input clock differential on In+ 1920 and In− 1930 and produce a differential output clock on Corr Clock_B 2090 and Corr Clock 2100. If the duty cycle deviates from 50% then the circuit shown in FIG. 19B will produce a differential error voltage signal pair Error+ 2300 and Error− 2200 from the differential pair 2230 and 2250 and capacitor 2260 acting as an integrator. Transistors 2220, 2280, 2290 and 2270 function as a load element especially suited for controlling the charge leakage across integrating capacitor 2260. The differential error voltage signal pair is fed back to the correcting stage 2005 such that the duty cycle error in the Corr Clock and Corr Clock_B signals is reduced by altering currents 2110 and 2120 depending on the polarity of the error. Thus, the output of the buffering stage 2055 is a clock having a duty cycle substantially close to 50%.

In FIG. 4, as in FIG. 3, Phase detector 220 compares the ClkIn signal, with the last phase vector K<r> 280 to determine the phase difference from a predetermined phase relationship between the two clocks, and signal PhDiff 225 represents that difference. In FIG. 3, PhDiff signal 225 contains random variations due to the instantaneous phase error which, when used directly by Counter Control 240, causes an amount of overall loop jitter, thus affecting the stability of the phase vectors. In FIG. 4, the amount of jitter is reduced by filtering the PhDiff signal before converting it to DlyAdj signal 260. Shown in FIG. 4 is an embodiment in which control circuit 230 includes filter 235 in addition to counter control 240 and digital to analog converter (DAC) 250. Filter circuit 235 receives an input, PhDiff 225, from phase detector 220 and CntClk 241 from buffer 238 and generates output PhDiffF 237 for input to the Counter Control 240, which receives CntClk 241 and generates count Cnt<c:0> 245 for input to DAC 250. In an embodiment in which the PhDiff signal is a digital signal, a digital filter is used, but either analog or digital filtering may be employed. CntClk 241 operates the circuitry in both Filter 235 and Counter Control 240. Buffer 238 is employed when ClkSrc is a small swing signal but Counter Control 240 and Filter 235 require a full swing signal.

Types of digital filters that can be employed to reduce loop jitter include a majority-detector filter or an unanimity-detector filter. In either filter type, CntClk 241 operates circuitry which samples and stores the state, either true or false, of PhDiff 225. A majority-detector filter saves the last N samples, where N is an odd number, of PhDiff signal 225 and determines whether a majority of the last N cycles, say 3 out of 5 (N), are the same. If so, then the majority-detector filter activates PhDiffF 237 to alter the count in counter control 240. This type of filter alters the count in counter control 240 on every sample because there is always a majority of true or false samples. An unanimity-detector filter also records the last N samples, where N can be even or odd, of the PhDiff signal but instead determines whether all N cycles are the same. If all samples are the same, the unanimity-detector filter activates the PhDiffF signal 237 to alter the count and at times during which not all the samples are the same, the PhDiffF signal will not be activated to alter the count. Both types of filters have the effect of reducing loop jitter, and either type may be used.

Figure 5:
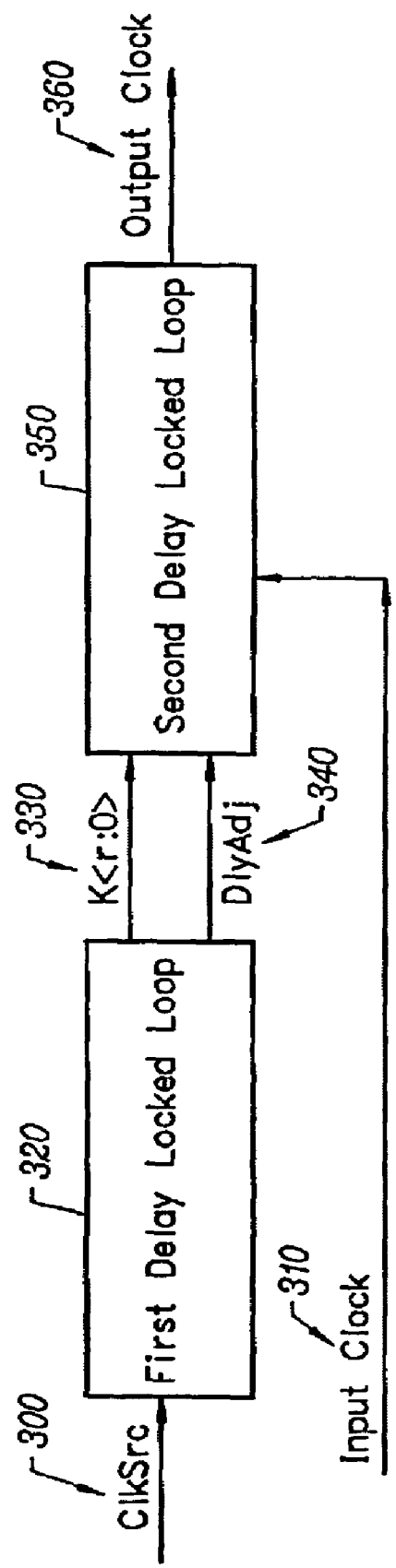
FIG. 5 shows a block diagram of the architecture of a DLL for generating an Output Clock in precise phase relationship with an Input Clock according to one embodiment.

Turning now to FIG. 5, a pair of delay locked loops is depicted for generating an output clock having predetermined phase relationship to an input clock. The first delay locked loop 320 is one which generates phase vectors K<r:0> 330 from a clock source ClkSrc 300 as described above. The phase vectors and the DlyAdj signal 340 are then used by a second delay locked loop 350 to create a precise phase relationship between Input Clock 310 and Output Clock 360.

Figure 6:
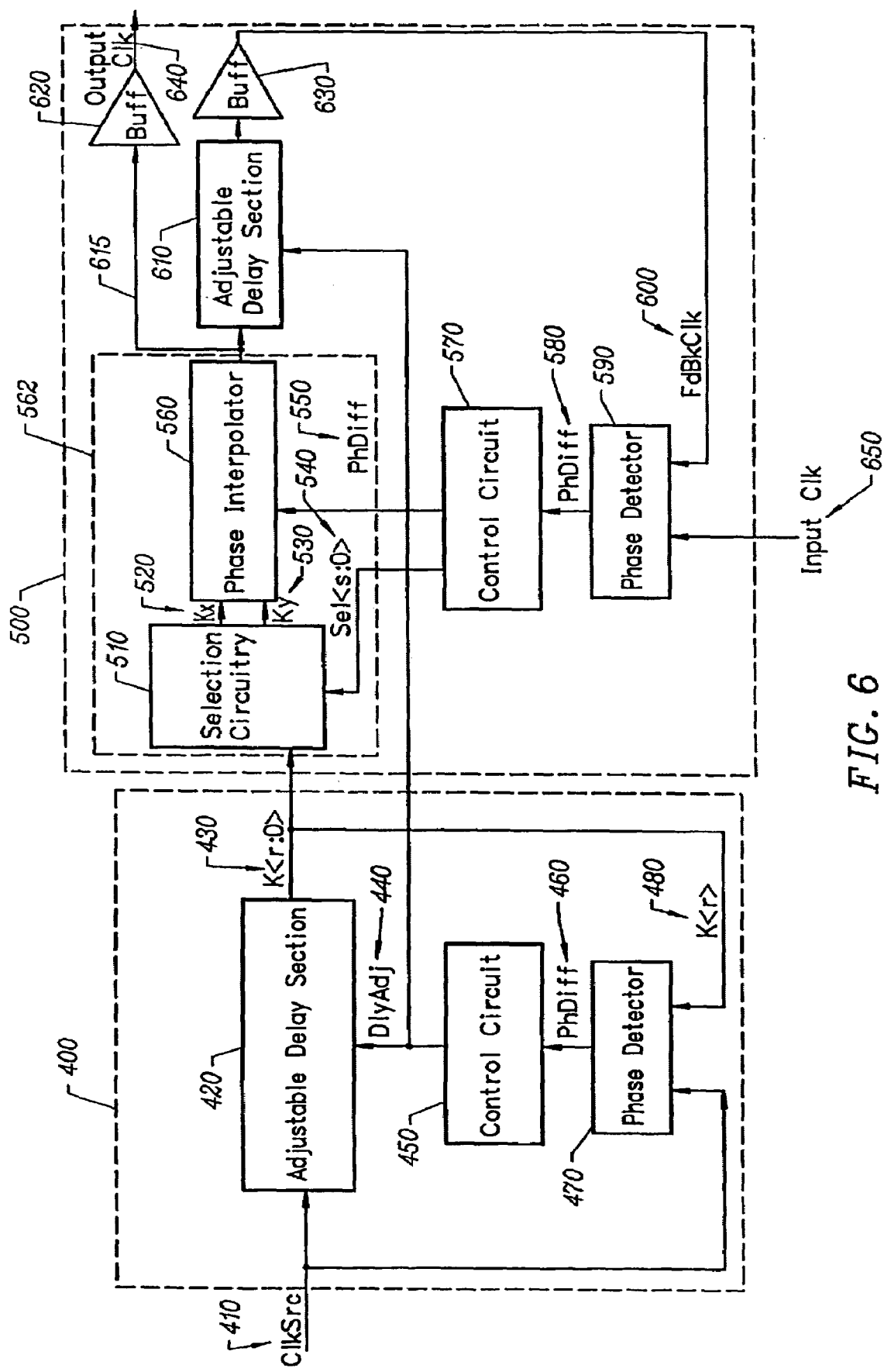
FIG. 6 shows a more detailed architecture than FIG. 5 of a DLL for generating an Output Clock in precise phase relationship with an Input clock according to one embodiment.

FIG. 6 shows an embodiment of the loop of FIG. 5 in more detail. First loop 400 is the phase vector loop which receives ClkSrc 410 and generates phase vectors K<r:0> 430 and DlyAdj signal 440. The second loop 500 is the loop for creating the phase relationship between the Input Clock 650 and Output Clk 640. Loop 500 comprises a selection circuitry 510, phase interpolator 560, adjustable delay section 610 which represents an integer multiple of adjustable delay elements, Clock Buffers 620 and 630, control circuit 570 and phase detector 590.

In FIG. 6, selection circuitry 510 receives the phase vectors 430 and passes along a selected pair of vectors Kx 520 and Ky 530, which are received by phase interpolator 560. The phase interpolator generates an interpolated output clock 615 which is buffered by clock buffer 620 to become the Output Clock 640.

Adjustable delay section 610 also receives output clock 615 and feeds the delayed clock to clock buffer 630 to generate FdBkClk 600. Control circuit generates PhAdj signal 550 for controlling the interpolator 560. Control circuit 570 receives phase difference information, PhDiff 580, from phase detector 590, which detects the difference in phase between the Input Clk 650 and FdBkClk 600. As described previously, control circuit 570 may comprise counter control 240 and DAC 250 such as in FIG. 3, to enable the saving of the setting of the current phase adjustment of the loop or Filter 235, Counter Control 240 and DAC 250 as in FIG. 4 to additionally reduce loop jitter.

Figure 18:
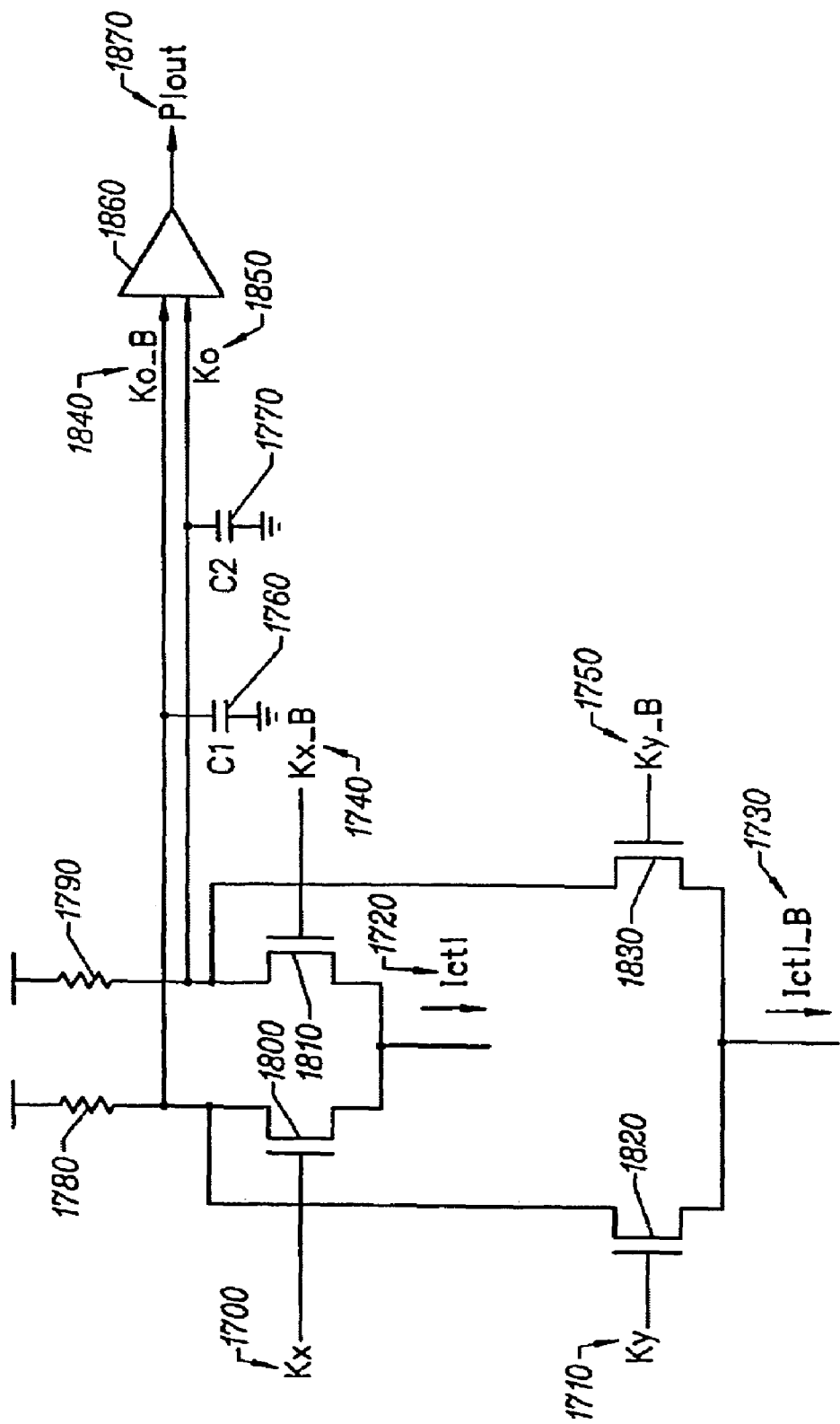
FIG. 18 shows an embodiment of a phase interpolator for use in a delay locked loop.

Selection circuitry 510 may be implemented as an analog or digital set of switches comprising a multiplexer, depending upon whether the phase vectors are low swing or full swing signals. Phase interpolator 560 may be implemented as shown in FIG. 18. Alternately, selection circuitry 510 may be merged or combined with interpolator 560, shown in FIG. 6 as block 562. In some embodiments when selection circuitry is combined with the phase interpolator, the circuit shown in FIG. 18 is duplicated several times, each duplicate connected to a different set of switches for applying a particular phase vector to the interpolator.

The operation of the circuit of FIG. 18 is substantially similar to the circuit shown in FIG. 16B. Differential pair 1800 and 1810 receive one of the selected phase vectors Kx 1700 and Kx_B 1740 which is the complement of the Kx signal. Kx and Kx_B may be generated from a delay element having differential outputs as shown in FIG. 16A or 16B. Differential pair 1820 and 1830 receive the Ky 1710 phase vector and the Ky_B 1750 complementary phase vector. The phase interpolator functions as a weighted integrator using capacitors C1 1760 and C2 1770 and coincidence detector 1860. If Ictl 1720 is set at a maximum value and Ictl_B 1730 is zero then the output signal PIout 1870 is in phase with the Kx clock but delayed by a stage delay through the interpolator. If Ictl_B 1730 is set a maximum value and Ictl 1720 is zero then the output signal is in phase with the Ky clock but delayed by a stage delay. By adjusting the values of adjustable currents 1720 and 1730 any delay between Kx and Ky may be achieved.

Figure 14:
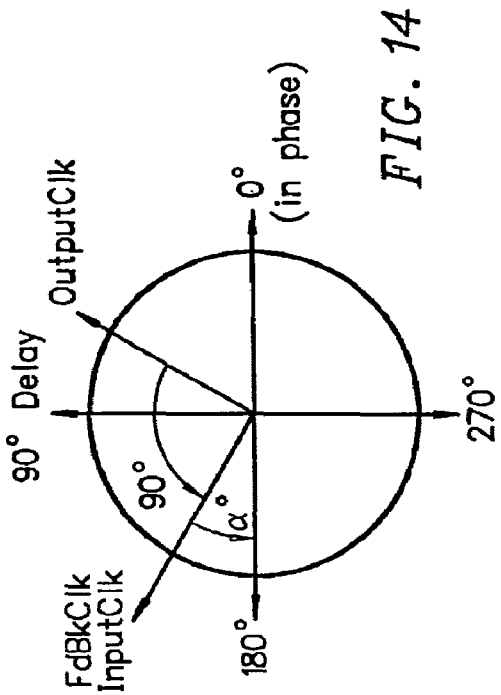
FIG. 14 shows a set of four phase vectors each separated by a 90 degree interval and spanning 360 degrees shift of the 0 degree vector, with the Input Clock and feedback clock between the 90 and 180 degree phase vectors and the Output Clock between the 0 and 90 degree vectors and 90 degrees earlier in time than the input clock.
Figure 15:
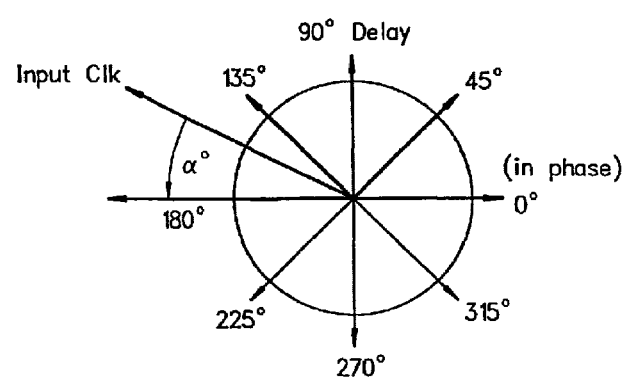
FIG. 15 depicts a case in which the input clock is between the 135 and 180 degree phase vectors, with the initially selected phase vectors being the 0 and 45 degree vectors.

The operation of loop 500 in FIG. 6 is as follows. Phase detector 590 determines what the difference in phase, if any, is between the Input Clk 650 and FdBkClk 600. This difference is then processed by control circuit 570 to select a pair of phase vectors via selection circuitry 510. The chosen pair of vectors is that pair between which the phase of Input Clk 650 lies, after accounting for fixed delays inherent in circuits in the path of the FdBkClk signal such as the phase selector, phase interpolator, adjustable delay section and clock buffer. An example of a pair of vectors meeting this requirement is shown in FIG. 14, in which the Input Clk is shown between the 90 degree and 180 degree vectors and at a delay of alpha degrees from the 180 degree vector. If the starting pair of vectors is not the correct pair then the control circuit steps through the pairs of vectors one step at a time until the correct pair is discovered. FIG. 15 depicts a circumstance in which the stepping of several phase vectors must occur if loop 500 starts in the 0 degree state before the correct pair is discovered. When the first pair of vectors, 0 and 45 degrees, is selected, the phase interpolator 560 is adjusted so that the phase interpolator output 615 is in phase with the 45 degree vector. While in this condition the 0 degree vector is replaced with the 90 degree vector by the control circuit and selection circuitry. Next, the phase interpolator is adjusted to produce an output in phase with the 90 degree vector and the 45 degree vector is replaced with the 135 degree vector. The phase interpolator is then adjusted to produce an output in phase with the 135 degree vector. Finally, the control circuit replaces the 90 degree vector with the 180 degree vector. Thus, while this stepping occurs the phase interpolator generates an output clock 615 which is in phase with one of the selected vectors, in particular, the one that will not be switched in selecting a new pair of vectors. The constraint that the interpolator generate the output clock in phase with the non-switched vector prevents the output clock from glitching during the stepping process. When the correct pair of vectors is determined by the loop then the phase interpolator is allowed to be adjusted by PhAdj signal 550 to precisely align the delayed output FdBkClk 600 to the phase of the Input Clk 650, which is at some phase, alpha degrees, (FIG. 14) from one of the selected phase vectors. When this occurs the loop is locked. FdBkClk 600 is delayed by at least one unit delay from adjustable delay section 610, the unit delay being precisely a delay between any two adjacent phase vectors 430 from the first loop because it is adjusted by the same DlyAdj 440 signal of the first loop. Thus, if the phase vectors from the first loop differ from each other by 90 degrees, then the unit delay is 90 degrees and the FdBkClk is delayed 90 degrees from the output of the phase interpolator 615, assuming one delay element in block 610. FIG. 14 shows this condition.

It will be noted that not only is a unit delay included in the feedback path of the second loop but so are the clock buffer and other fixed delays inherent in the phase selector and phase interpolator. Clock buffers 620 and 630 are matched buffers having the same physical construction. FdBkClk is thus delayed by an amount equal to a unit delay and a clock buffer delay plus the other fixed delays from the phase selector and phase interpolator. However, because the Output Clock 640 is delayed by the same amount of fixed delays, the clock buffer delays and fixed delays cancel and the difference between the Output Clk 640 and the Input Clock 640 is only the unit delay.

It should be noted that adjustable delay section 610 could comprise an integer multiple of unit delays, in which case the delay between the Input Clk 650 and Output Clk 640 would then be the integer multiple of unit delays. For example, if the multiple of the unit delay is 3 and the value of the unit delay 10 degrees then the Output Clk would lead the Input Clk by 30 degrees. If the multiple of the unit delay is zero, then the Input Clk and Output Clk would be in phase.

Figure 7:
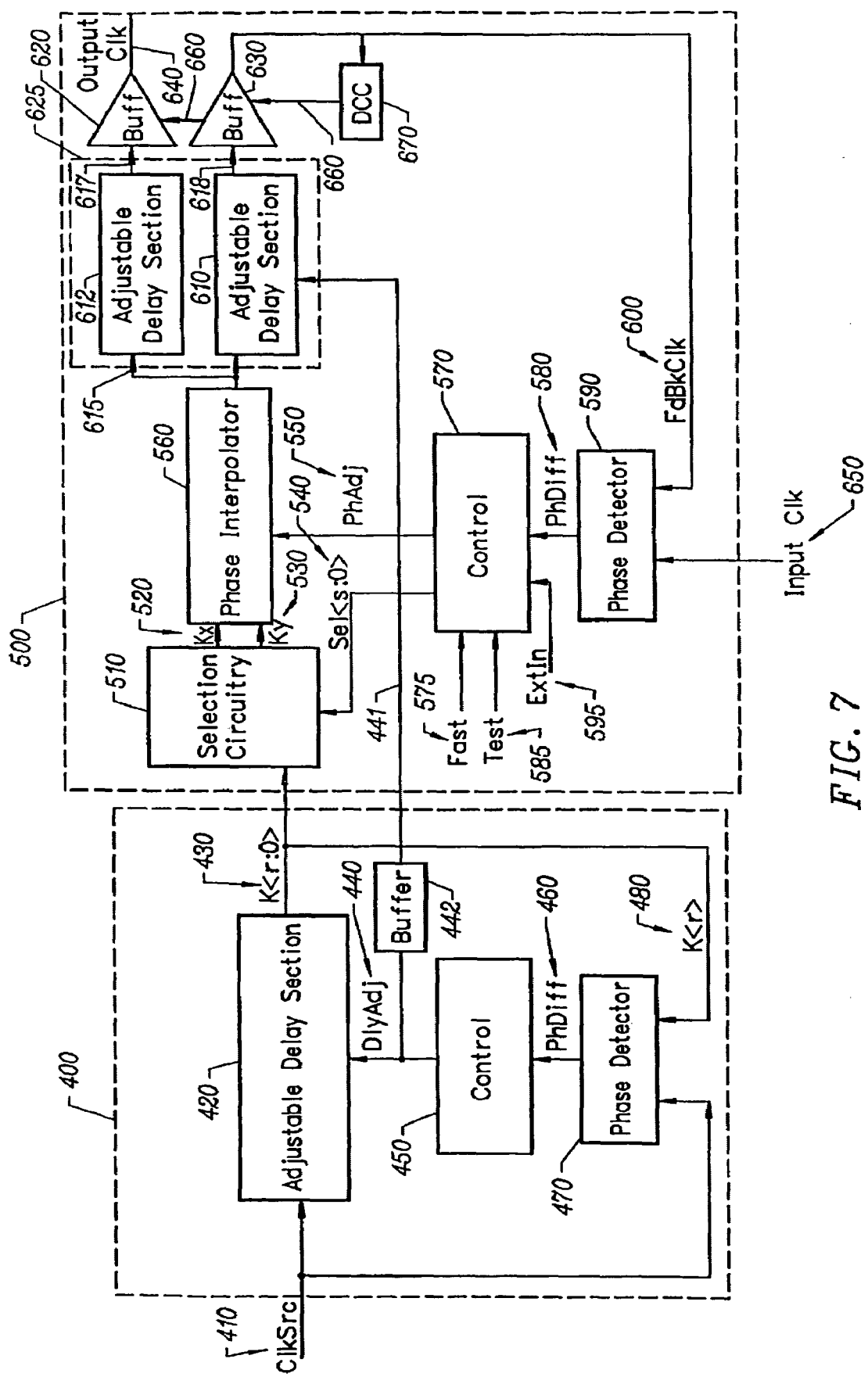
FIG. 7 shows another embodiment of a DLL for generating an Output Clock in precise phase relationship with an Input Clock using an adjustable delay section in the path of both the Output clock and the feedback clock.

FIG. 7 is an alternate embodiment showing adjustable delay section 612 in the path of the Output Clk 640. This section has the same implementation as the section in the path of the FdBkClk 600 and provides a way for the Output Clk signal 640 to not only lead the Input Clk in phase but to lag it in phase. This latter condition occurs when the adjustable delay section 612 comprises a larger multiple of unit delays than adjustable delay section 610. Adjustable delay sections 612 and 610 may be implemented in a fashion similar to section 206 in FIG. 4 in order to insure that phase errors due to loading differences are minimized. The delay circuits shown in FIGS. 16A and 16B are suitable for implementing an adjustable delay element employed in the adjustable delay section 610 or 612. FIG. 7 also shows that buffers 620 and 630 may be implemented as duty cycle correcting amplifiers with the aid of duty cycle correction circuit 670. Buffers 620 and 630 may be implemented according to the circuitry shown in 19A and duty cycle correction circuit 670 may be implemented as shown in FIG. 19B. Finally, FIG. 7 shows three more inputs, Fast 575, Test 585 and ExtIn 595, to the control circuit 570. In one embodiment Fast signal 575 is used to alter the control circuit so that the loop can lock more quickly by taking larger phase adjustments toward the lock condition. In an embodiment in which the control circuit 570 is implemented as a counter, the Past signal 575 can cause the counter to count by a multiple of the smallest step between counts. The Test signal 585 is used to allow the control circuit to be under the control of external signal ExtIn 595 rather than PhDiff 580 derived from the loop. This allows loop properties to be tested more easily.

Figure 8:
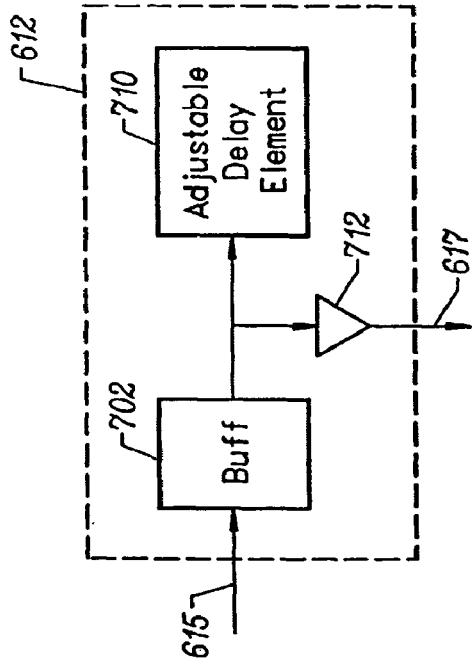
FIG. 8 shows another embodiment of an adjustable delay section having one adjustable delay for use in FIG. 7.
Figure 9:
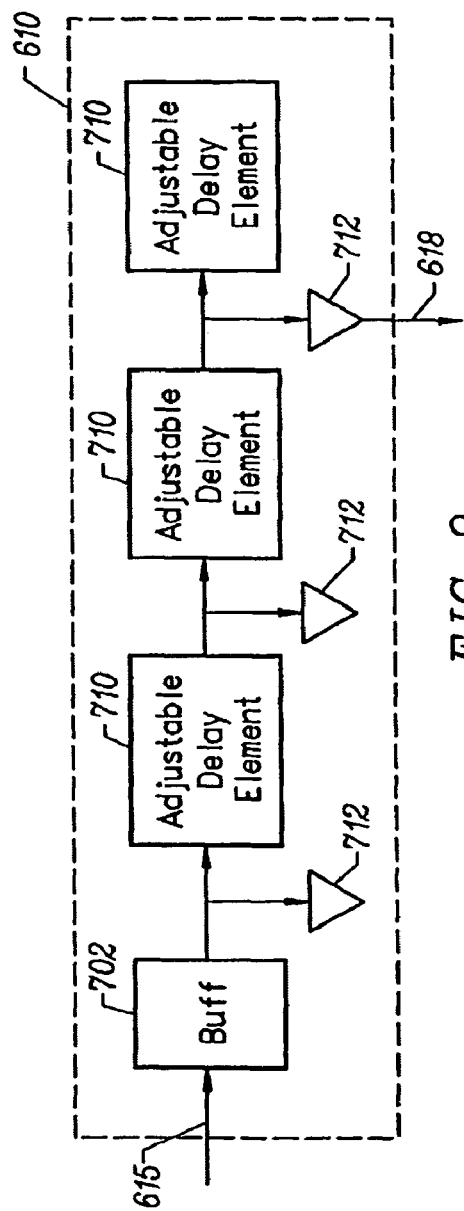
FIG. 9 shows another embodiment of an adjustable delay section having at least two adjustable delays for use in FIG. 7.
Figure 10:
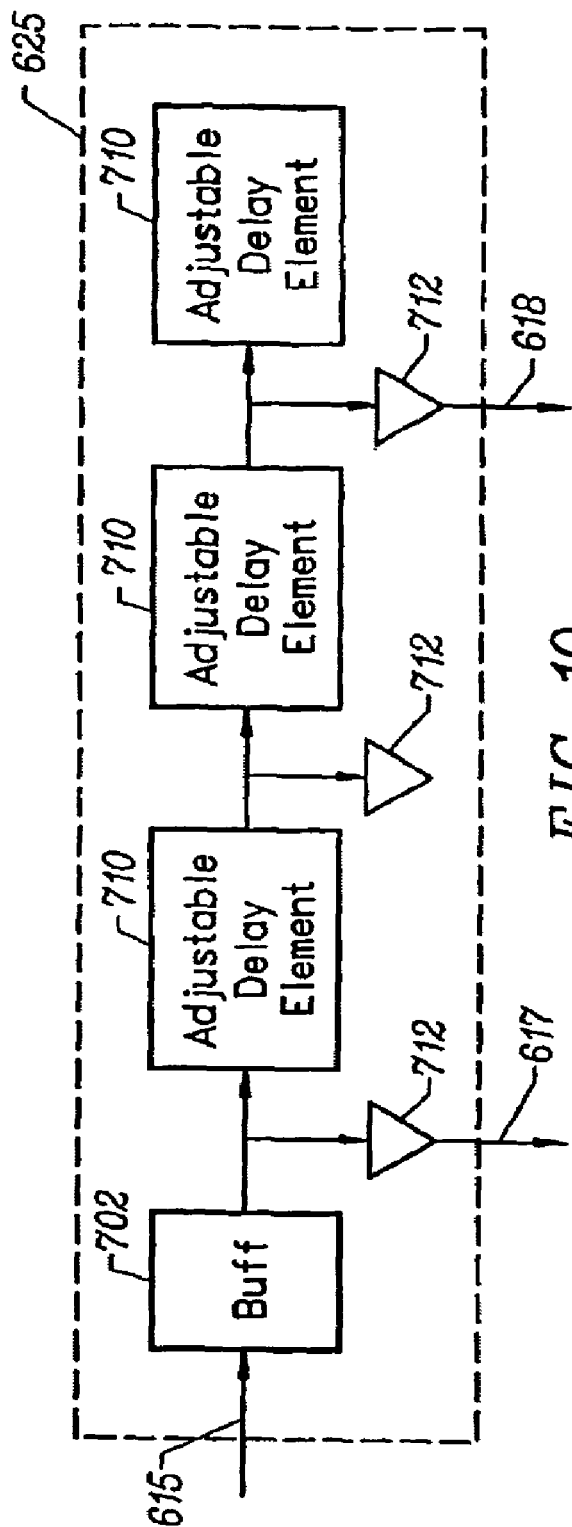
FIG. 10 shows an embodiment for producing a pair of delays from the same chain for use in FIG. 7.

FIG. 8 shows one embodiment of adjustable delay section 612. Block 612 comprises a buffer 702, similar to 202 in FIG. 4, an adjustable delay element 710 similar to adjustable delay element 210 in FIG. 4, and an output buffer 712 similar to the 212 buffer in FIG. 4. FIG. 9 shows an embodiment of adjustable delay section 610. This figure is similar to FIG. 8 but has more adjustable delay elements, but is still buffered at the front of the chain and has an additional delay element at the end of the chain. The adjustable delay sections in both FIG. 8 and FIG. 9 are controlled from an external delay adjust signal such as 441 as shown in FIG. 7, such that the setting produces a delay equal to the delay between phase vectors. If the adjustable delay sections are implemented in this fashion, loading differences are kept to a minimum and only the desired phase difference between signal 617 and 618 is generated. As may be easily seen it is not necessary that adjustable delay sections 610 and 612 be implemented as two separate and distinct sections. It is convenient in some embodiments to derive 617 and 618 from the same section 625 as shown in FIG. 7 and 10. The delay adjust signal 441 in FIG. 7 is buffered by buffer 442, in some embodiments, to isolate the loading effects of sections 610 and 612 from section 420.

Figure 20:
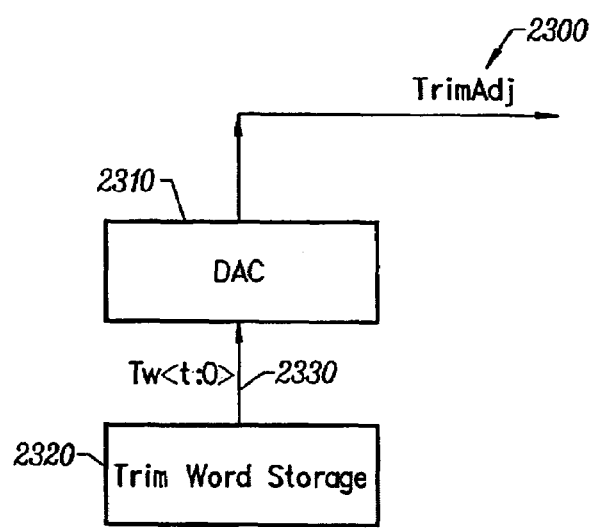
FIG. 20 is a block diagram of a TrimAdj circuit for use in one variation of the embodiment of FIG. 7.

FIG. 20 discloses circuitry for biasing the predetermined phase relationship between the input clock and the output clock with a fixed offset. The fixed offset is necessary when system requirements dictate that the predetermined phase relationship be altered by an amount that is smaller than is available from a unit a delay, for example a one degree phase shift. This fine tuning or trimming is accomplished by the TrimAdj signal 2300 which is combined with the DlyAdj signal 441 in FIG. 7. The TrimAdj signal 2300 adds a small amount of adjustment current to the adjustable delay sections 610 and 612. This causes the delay elements in those sections to have a delay that is slightly smaller or larger than the unit delay provided by the delay adjustment signal from the loop which generates the phase vectors. For example, if the delay elements in 610 and 612 are increased by one degree and the unit delay is 90 degrees than each delay element has a delay of 91 degrees. Because the delay between the input clock and the output clock is the difference in delay between the path of the output clock and the path of the feedback clock, the output clock is now 91 degrees ahead of the input clock. In FIG. 20, the TrimAdj signal 2300 is derived from DAC 2310 and trim word storage 2320. Trim word storage in some embodiments is a set of fuses or other permanent storage for holding a digital code TW<t:0> 2330 for setting the trim delay. DAC 2310 converts the trim word 2330 to an analog signal such as a current for controlling the delay elements in sections 610 and 612.

Figure 21:
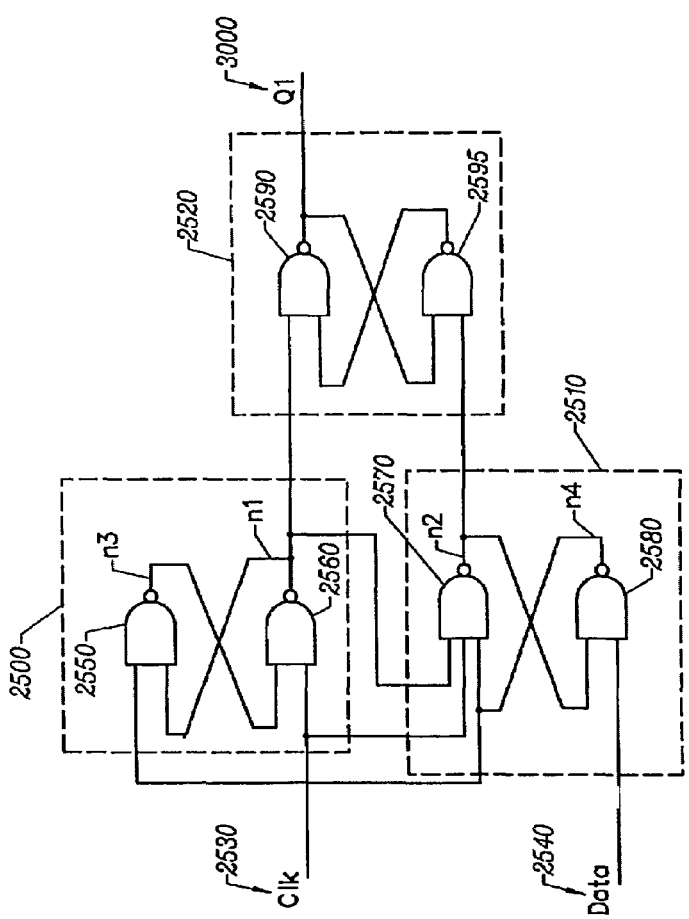
FIG. 21 is a circuit diagram of one embodiment of a phase detector as set forth in FIG. 6.

FIG. 21 is a circuit diagram of a phase detector circuit which could be used for the phase detector of FIGS. 2, 3, 4, 6 and 7. A clock input 2530 is shown, and data input 2540 would correspond to the feedback clock or phase vector. Output 3000 is the phase difference signal provided to the control circuit. The phase detector is implemented as three blocks 2500, 2510, and 2520 connected in flip-flop fashion using NAND gates 2550, 2560, 2570, 2580, 2590, and 2595.

Figure 22:
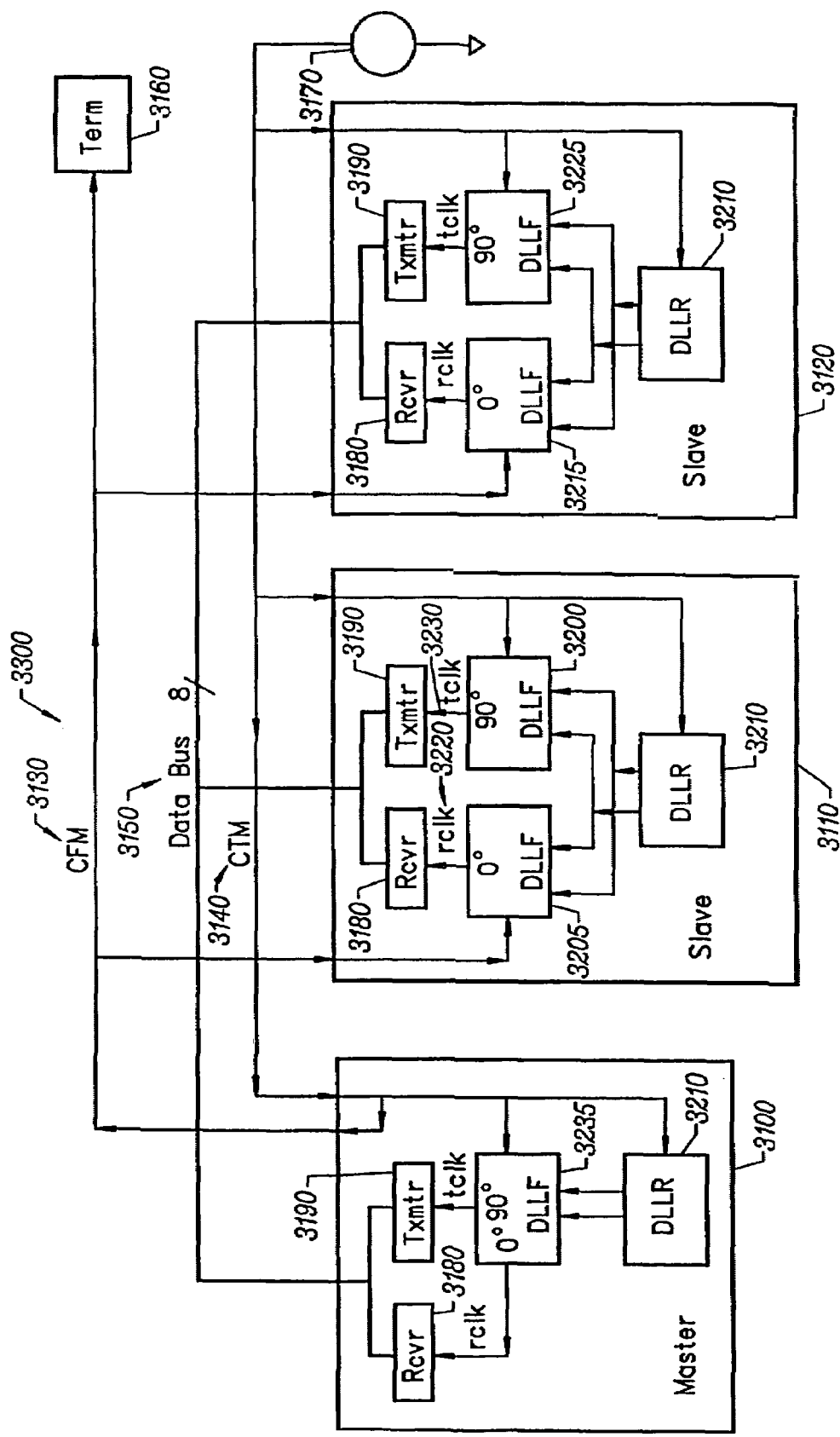
FIG. 22 is a block diagram of a DRAM system incorporating the present invention.

FIG. 22 shows a system application for the delay locked loops of the present invention. In the case shown, master device 3100 communicates with slave device 3110 or slave device 3120. Slave devices 3110 or 3120 may communicate with master device 3100 but not with each other. The system operates from a pair of clocks generated from oscillator 3170 which generates CTM (Clock To Master) 3140 and CFM (Clock From Master) 3130. CTM travels in the direction from the slave device to the master device and is used for transmitting data to the master on data bus 3150. In the master, CTM is looped back to generate CFM which travels in the direction from master to slave device and is used for transmitting data from the master to the slave device. Each device, master or slave, has a data receiver Rcvr 3180 and a data transmitter Txmtr 3190 for receiving and sending data respectively. The Rcvr 3180 uses a signal rclk 3220 to receive the data from the data Bus and Txmtr 3190 uses tclk 3230 to transmit the data onto the data bus. Signals rclk and tclk are generated from a pair of delay locked loops 3200 and 3205 in the slave and from a single delay locked loop 3235 in the master, because the master makes no distinction between CTM and CFM.

In FIG. 22 DLLR 3210 is the delay locked loop for generating the phase vectors and is called the reference loop. Each device uses a single DLLR loop. DLLF 3200 is the delay locked loop for generating a predetermined phase relationship between the input clock and the output clock. The DLLF 3200 loop is used to generate a 90 degree phase relationship between CTM and tclk, because data is always transmitted in quadrature to the receive clock. The DLLF 3205 is used to generate a zero degree phase relationship between CFM and rclk. Thus, when a slave sends data to the master, the data changes occur 90 degrees out of phase with the CTM clock, the clock traveling toward the master. The master receives the clock CTM and generates the rclk signal for operating its receiver. Signal rclk in the master is in a 0 degree phase relationship with CTM so that the data is sampled when it is not changing. Similarly, when the master sends data to a slave, it clocks its transmitter changing the data on the data bus with tclk which is in a 90 degree phase relationship with the CFM. A slave 3110 receiving the data in its receiver 3180 operates its receiver using rclk which has a 0 degree phase relationship with the CFM. Thus, the receiver will sample the data when it is not changing. In this manner, data may be transmitted using both edges of the CTM or CFM clocks and safely sampled in the receiver.

In one embodiment, the master of FIG. 22 is an intelligent device, such as a microprocessor, an application specific integrated circuit (ASIC), a memory controller, or a graphics engine. The slave devices may be DRAMs, SRAMs, ROMs, EPROMs, flash memories, or other memory devices.

In the foregoing specification the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A clock alignment system, comprising:
    a receiver adapted to be coupled to a data bus and configured to receive data in accordance with a receive clock;
    a first delay-locked loop configured to generate a plurality of phase vectors from a first reference clock; and
    a second delay-locked loop coupled to the first delay-locked loop and configured to generate the receive clock from a set of phase vectors selected from the plurality of phase vectors and a second reference clock, wherein the second reference clock is distinct from the first reference clock.

2. The system of claim 1, wherein the second delayed-lock loop is configured to generate a substantially zero degree phase relationship between the second reference clock and the receive clock.

3. The system of claim 1, wherein the first and second reference clocks are derived from the same clock source.

4. The system of claim 1, wherein the system is part of a graphics engine.

5. The system of claim 1, wherein the first delay-locked loop further comprises:
    a first adjustable delay circuit coupled to the first reference clock and a delay adjustment signal, the first adjustable delay circuit configured to provide phase vectors based at least in part on the delay adjustment signal;
    a first phase detector coupled to the first reference clock and the first adjustable delay circuit, the first phase detector configured to provide a first phase difference signal indicative of the phase difference between the first reference clock and a respective phase vector; and
    a first control circuit coupled to the first phase detector and configured to provide the delay adjustment signal based on the first phase difference signal.

6. The system of claim 5, wherein the second delay-locked loop further comprises:
    a selection circuit adapted to receive phase vectors from the first delay-locked loop and configured to select the set of phase vectors in response to a selection signal;
    a phase interpolator coupled to the selection circuit and a second phase adjustment signal, the phase interpolator configured to use the second phase adjustment signal at least in part to provide an output clock which is in phase with one of the selected phase vectors;
    a second adjustable delay circuit coupled to the phase interpolator and the delay adjustment signal provided by the first delay-locked loop and configured to generate a feedback clock based at least in part on the delay adjustment signal;
    a second phase detector coupled to receive the second reference clock and the feedback clock and configured to provide a phase difference between the second reference clock and the feedback clock; and
    a second control circuit coupled to the second phase detector and configured to provide the selection signal and the phase adjustment signal to the selection circuitry and phase interpolator, respectively, based at least in part on the phase difference between the second reference clock and the feedback clock.

7. The system of claim 6, further comprising:
    a trim adjustment circuit coupled to the delay adjustment signal and configured to bias the delay adjustment signal so as to increase or decrease the amount of delay provided by the second adjustable delay circuit.

8. The system of claim 7, wherein the trim adjustment circuit biases the delay adjustment signal with an analog signal derived from a digital-to-analog converter and a digital representation of a trim value.

9. A clock alignment system, comprising:
a transmitter adapted to be coupled to a data bus and configured to transmit data in accordance with a transmit clock;
a first delay-locked loop configured to generate a plurality of phase vectors from a reference clock; and
a second delay-locked loop coupled to the first delay-locked loop and configured to generate the transmit clock from a set of phase vectors selected from the plurality of phase vectors and an input clock, wherein the input clock is distinct from the reference clock.

10. The system of claim 9, wherein the second delayed-lock loop is configured to generate a substantially ninety degree phase relationship between the reference clock and the transmit clock.

11. The system of claim 9, wherein the system is part of a graphics engine.

12. The system of claim 9, wherein the first delay-locked loop further comprises:
a first adjustable delay circuit coupled to the reference clock and a delay adjustment signal, the first adjustable delay circuit configured to provide phase vectors based at least in part on the delay adjustment signal;
a first phase detector coupled to the reference clock and the first adjustable delay circuit, the first phase detector configured to provide a phase difference signal indicative of the phase difference between the reference clock and a respective phase vector; and
a first control circuit coupled to the first phase detector and configured to provide the delay adjustment signal based on the phase difference signal.

13. The system of claim 12, wherein the second delay-locked loop further comprises:
a selection circuit adapted to receive phase vectors from the first delay-locked loop and configured to select the set of phase vectors in response to a selection signal;
a phase interpolator coupled to the selection circuit and a phase adjustment signal, the phase interpolator configured to use the phase adjustment signal at least in part to provide an output clock which is in phase with one of the selected phase vectors;
a second adjustable delay circuit coupled to the phase interpolator and the delay adjustment signal provided by the first delay-locked loop and configured to generate a feedback clock based at least in part on the delay adjustment signal;
a second phase detector coupled to receive the input clock and the feedback clock and configured to provide a phase difference between the input clock and the feedback clock; and
a second control circuit coupled to the second phase detector and configured to provide the selection signal and the phase adjustment signal to the selection circuitry and phase interpolator, respectively, based at least in part on the phase difference between the input clock and the feedback clock.

14. The system of claim 13, further comprising:
a trim adjustment circuit coupled to the delay adjustment signal and configured to bias the delay adjustment signal so as to increase or decrease the amount of delay provided by the second adjustable delay circuit.

15. The system of claim 14, wherein the trim adjustment circuit biases the delay adjustment signal with an analog signal derived from a digital-to-analog converter and a digital representation of a trim value.

16. A clock alignment system including a master device and a slave device adapted to be coupled to a data bus and clock lines, comprising:
a master device including a first receiver, comprising:
a first delay-locked loop configured to generate a plurality of phase vectors from a first reference clock received from a first clock line; and
a second delay-locked loop coupled to the first delay-locked loop and configured to generate a first receive clock from a set of phase vectors selected from the plurality of phase vectors and a second reference clock from a second clock line, wherein the second delayed-lock loop is configured to generate a substantially zero degree phase relationship between the second reference clock and the first receive clock; and
a slave device including a second receiver, comprising:
a third delay-locked loop configured to generate another plurality of phase vectors from a third reference clock received from a third clock line; and
a fourth delay-locked loop coupled to the third delay-locked loop and configured to generate a second receive clock from an additional two phase vectors selected from the another plurality of phase vectors and a fourth reference clock received from a fourth clock line, wherein the fourth delayed-lock loop is configured to generate a substantially zero degree phase relationship between the fourth reference clock and the second receive clock.

17. The system of claim 16, wherein the master device includes a transmitter coupled to the second delay-locked loop and configured to generate a substantially 90 degree phase relationship between the first reference clock and a first transmit clock.

18. The system of claim 16, wherein the slave device includes a transmitter coupled to the fourth delay-locked loop and configured to generate a substantially 90 degree phase relationship between the third reference clock and a second transmit clock.

19. The system of claim 16, wherein the first, second, third and fourth reference clocks are derived from the same clock source.

20. The system of claim 16, wherein the master device and slave device are separate integrated circuit chips.

21. A clock alignment system including a first integrated circuit device and a second integrated circuit device, the second integrated circuit device comprising:
a selection circuit adapted to receive phase vectors from the first integrated circuit device and configured to select a set of phase vectors in response to a selection signal;
a phase interpolator coupled to the selection circuit and a phase adjustment signal, the phase interpolator configured to use the phase adjustment signal at least in part to provide an output clock which is in phase with one of the selected phase vectors;
an adjustable delay circuit coupled to the phase interpolator and a delay adjustment signal from the first integrated circuit device and configured to generate a feedback clock based at least in part on the delay adjustment signal;

a phase detector coupled to receive an input clock and the feedback clock and configured to provide a phase difference between the input clock and the feedback clock; and a control circuit coupled to the phase detector and configured to provide the selection signal and the phase adjustment signal to the selection circuitry and phase interpolator, respectively, based at least in part on the phase difference between the input clock and the feedback clock.

22. The system of claim 21, further comprising:

a trim adjust circuit coupled to the delay adjustment signal and configured to bias the delay adjustment signal so as to increase or decrease the amount of delay provided by the adjustable delay circuit.

23. The system of claim 22, wherein the trim adjustment circuit biases the delay adjustment signal with an analog signal derived from a digital-to-analog converter and a digital representation of a trim value.

24. The system of claim 21, wherein the adjustable delay circuit further comprises:

a first adjustable delay section having a first predetermined number of delay elements;

a second adjustable delay section having a second predetermined number of delay elements, wherein the first predetermined number of delay elements is greater than the second predetermined number of delay elements; and circuitry for selecting between the first and second adjustable delay sections so as to provide a phase lead or lag between the input clock and the output clock.

25. The system of claim 21, wherein the control circuit is configured to adjust the phase adjustment signal in response to a control signal.

26. A system including a plurality of integrated circuit devices, each integrated circuit device of the plurality of integrated circuit devices comprising:

a transmitter to transmit data to a receiving integrated circuit device of the plurality of integrated circuit devices;

a first adjustable delay section to receive a reference clock signal and output a first internal clock signal having a delay with respect to the reference clock signal, wherein the delay is controlled by a control signal;

a first phase detector to receive the reference clock signal and the first internal clock signal and generate the control signal based on a phase difference between the first internal clock signal and the reference clock signal;

a second adjustable delay section to generate a receive clock signal by interpolation such that a phase of the receive clock signal with respect to an external clock signal is based at least in part on the control signal; and a receiver to sample data, transmitted by a transmitter of another integrated circuit device of the plurality of integrated circuit devices, in response to the receive clock signal.

27. The system of claim 26, wherein each integrated circuit device of the plurality of integrated circuit devices further includes:

a first selection circuit, coupled to the first adjustable delay section, to select a first pair of clock signals from a plurality of clock signals generated by the first adjustable delay section;

first interpolator circuitry, coupled to the second adjustable delay section, to generate a second internal clock signal using the pair of clock signals of the plurality of clock signals such that the phase of the second internal clock signal is interpolated from respective phases of the pair of clock signals based on a phase difference between the external clock signal and a first feedback clock signal, wherein the second internal clock signal is input to the second adjustable delay section;

a third adjustable delay section, coupled to the first interpolator circuitry, to output the first feedback clock signal having a delay with respect to the second internal clock signal that is controlled using the control signal; and a second phase detector, coupled to the first selection circuit and the first interpolator circuitry, to control the first selection circuit and the first interpolator circuitry based on the phase difference between the external clock signal and the first feedback clock signal.

28. The system of claim 27, wherein at least one integrated circuit device of the plurality of integrated circuit devices further includes:

a fourth adjustable delay section to receive the control signal and generate a transmit clock signal having a phase with respect to the external clock signal that is controlled by the control signal, wherein the transmitter transmits the data in response to the transmit clock signal;

a second selection circuit coupled to the first adjustable delay section to select a second pair of clock signals from the plurality of clock signals generated by the first adjustable delay section;

a third phase detector, coupled to the fourth adjustable delay section and the second selection circuit, to compare the external clock signal with a second feedback clock signal, and control the second selection circuit based on a difference in phase between the external clock signal and the second feedback clock signal;

second interpolator circuitry to generate a third internal clock signal using the second pair of clock signals such that the phase of the third internal clock is interpolated from respective phases of the second pair of clock signals based on the difference in phase between the external clock signal and the second feedback clock signal; and a fifth adjustable delay section, coupled to the second interpolator circuitry, to receive the third internal clock signal and output the second feedback clock signal having a delay with respect to the third internal clock signal that is controlled using the control signal.

29. The system of claim 26, further including:

a clock generator integrated circuit to generate the external clock signal; and a clock line coupled to the clock generator integrated circuit and each integrated circuit device of the plurality of integrated circuit device, and wherein the external clock signal propagates on the clock line and is received by each integrated circuit device of the plurality of integrated circuit devices.

30. The system of claim 29, wherein the clock line includes:

a first segment having a first end and a second end, wherein the first end is coupled to the clock generator; and a second segment having a first end coupled to the second end of the first segment and a second end coupled to a termination element.

31. The system of claim 30, wherein at least one integrated circuit device of the plurality of integrated circuit devices includes:

a transmit clock terminal coupled to the first segment to receive the external clock signal propagating on the first segment, wherein the transmitter transmits the data to the receiving integrated circuit device using the external clock signal received at the transmit clock terminal; and a receive clock terminal coupled to the second segment to receive the external clock signal propagating on the second segment, wherein the receiver samples the data transmitted by the transmitter of another integrated circuit device using the external clock signal received at the receive clock terminal.

32. The system of claim 26, wherein the transmitter transmits the data to the receiving integrated circuit device such that transitions of the data are in a quadrature alignment with respect to transitions of the external clock signal.

33. The system of claim 26, wherein each integrated circuit device of the plurality of integrated circuit devices receives the external clock signal and generates an internal transmit clock signal using a delay locked loop circuit such that the internal transmit clock signal includes a controlled phase relationship with respect to the external clock signal, wherein the transmitter transmits the data to the receiving integrated circuit device using the transmit clock signal.

34. The system of claim 26, wherein the reference clock signal and the external clock signal are the same clock signal.

35. The system of claim 26, wherein a first integrated circuit device of the plurality of integrated circuit devices is a memory controller device and the other integrated circuit devices of the plurality of integrated circuit devices are integrated circuit memory devices.

36. The system of claim 26 further including a duty cycle correction circuit coupled to the first adjustable delay section to adjust a duty cycle of the reference clock signal.

37. The system of claim 26 wherein the transmitter transmits the data to the receiving integrated device using edges selected from the group consisting of rising and falling edges of the external clock signal.

38. A method of operation in a system including first and second integrated circuit devices, the method comprising:
the first integrated circuit device transmitting data onto a first signal line; and
the second integrated circuit device:
sampling the data from the first signal line in response to transitions of a receive clock signal;
comparing a phase of an external clock signal with the phase of a first feedback clock signal to generate a control signal indicative of a phase difference between the external clock signal and the first feedback clock signal;
generating a first internal clock signal using a first adjustable delay section, wherein the first internal clock signal includes a delay with respect to the external clock signal, wherein the delay is controlled based on the control signal; and
generating the receive clock signal by interpolation using a second adjustable delay section such that a phase of the receive clock with respect to the external clock signal is based at least in part on the control signal.

39. The method of claim 38, further including generating the external clock signal using a clock generator integrated circuit.

40. The method of claim 38, wherein the first integrated circuit device transmits the data such that transitions of the data are in a quadrature alignment with respect to transitions of the external clock signal.

41. The method of claim 38, further including, the first integrated circuit device:
receiving the external clock signal; and
generating an internal transmit clock signal using a delay locked loop circuit such that the internal transmit clock signal includes a controlled phase relationship with respect to the external clock signal, wherein the transmitter transmits the data onto the first signal line using the transmit clock signal.

42. The method of claim 38, wherein the second integrated circuit device uses the external clock signal as the reference clock signal.

43. The method of claim 38, further including:
generating a plurality of clock signals using the first adjustable delay section;
selecting a pair of clock signals from the plurality of clock signals;
comparing a phase of the external clock signal with the phase of a second feedback clock signal to generate a second control signal indicative of a phase difference between the external clock signal and the second feedback clock signal;
generating a second internal clock signal using the pair of clock signals such that the phase of the second internal clock signal is interpolated from respective phases of the pair of clock signals in accordance with the second control signal indicative of the phase difference between the external clock signal and the second feedback clock signal; and
generating the second feedback clock signal using a third adjustable delay section that receives the second internal clock signal, wherein a delay of the second feedback clock signal with respect to the second internal clock signal is controlled in response to the second control signal indicative of the phase difference between the external clock signal and the second feedback clock signal.

44. The method of claim 43, wherein the pair of clock signals are selected according to the difference in phase between the external clock signal and the second feedback clock signal.

45. The method of claim 38, wherein the first integrated circuit device transmits data using edges selected from the group consisting of rising and falling edge transitions of the external clock signal.

46. The method of claim 38, wherein the second integrated circuit device samples the data from the first signal line using edges selected from the group consisting of rising and falling edge transitions of the external clock signal.

47. The method of claim 38, wherein the first integrated circuit device is a memory device including a memory array having memory cells capable of storing the data and wherein the second integrated circuit device is a memory controller device that controls the operation of the first integrated circuit device.

48. An integrated circuit device comprising:
a receiver to sample data from an external signal line in response to a receive clock signal;
a first adjustable delay section to receive a reference clock signal and output a first internal clock signal having a delay with respect to the reference clock signal, wherein the delay is controlled by a control signal;
a first phase detector to receive the reference clock signal and the first internal clock signal and generate the control signal based on a phase difference between the first internal clock signal and the reference clock signal; and a second adjustable delay section to generate the receive clock signal by interpolation such that a phase of the receive clock signal with respect to an external clock signal is controlled in response to the control signal.

49. The integrated circuit device of claim 48, further including:
a first selection circuit, coupled to the first adjustable delay section, to select a first pair of clock signals from a plurality of clock signals generated by the first adjustable delay section;
first interpolator circuitry, coupled to the second adjustable delay section, to generate a second internal clock signal using the pair of clock signals of the plurality of clock signals such that the phase of the second internal clock signal is interpolated from respective phases of the pair of clock signals based on a phase difference between the external clock signal and a first feedback clock signal, wherein the second internal clock signal is input to the second adjustable delay section;
a third adjustable delay section, coupled to the first interpolator circuitry, to receive the second internal clock signal and output the first feedback clock signal having a delay with respect to the second internal clock signal that is controlled using the control signal; and
a second phase detector, coupled to the first selection circuit and the first interpolator circuitry, to control the first selection circuit and the first interpolator circuitry based on the phase difference between the external clock signal and the first feedback clock signal.

50. The integrated circuit device of claim 49, further including:
a transmitter to transmit data to a receiving integrated circuit device in response to a transmit clock signal;
a fourth adjustable delay section to generate the transmit clock signal having a phase with respect to the external clock signal that is controlled by the control signal;
a second selection circuit coupled to the first adjustable delay section to select a second pair of clock signals from the plurality of clock signals generated by the first adjustable delay section;
a third phase detector, coupled to the fourth adjustable delay section and the second selection circuit, to compare the external clock signal with a second feedback clock signal, and control the second selection circuit based on a difference in phase between the external clock signal and the second feedback clock signal;
second interpolator circuitry to generate a third internal clock signal using the second pair of clock signals such that the phase of the third internal clock is interpolated from respective phases of the second pair of clock signals based on the difference in phase between the external clock signal and the second feedback clock signal; and
a fifth adjustable delay section, coupled to the second interpolator circuitry, to receive the third internal clock signal and output the second feedback clock signal having a delay with respect to the third internal clock signal that is controlled using the control signal.

51. The integrated circuit device of claim 48, further including a transmitter to transmit data to a receiving integrated circuit device.

52. The integrated circuit device of claim 51, wherein the transmitter transmits the data to the receiving integrated circuit device such that transitions of the data are in a quadrature alignment with respect to transitions of the external clock signal.

53. The integrated circuit device of claim 51, wherein the transmitter transmits the data to the receiving integrated device using edges selected from the group consisting of rising and falling edges of the external clock signal.

54. The integrated circuit device of claim 51, further including:
a transmit clock terminal to receive the external clock signal propagating on a first clock line segment, wherein the transmitter transmits the data to the receiving integrated circuit device using the external clock signal received at the transmit clock terminal; and
a receive clock terminal to receive the external clock signal propagating on a second clock line segment, wherein the receiver samples the data transmitted by the transmitter of another integrated circuit device using the external clock signal received at the receive clock terminal.

55. The integrated circuit device of claim 48, wherein the reference clock signal and the external clock signal are the same clock signal.

56. The integrated circuit device of claim 48, further including a duty cycle correction circuit coupled to the first adjustable delay section to adjust a duty cycle of the reference clock signal.

57. The integrated circuit device of claim 48, wherein the receiver samples the data transmitted by the transmitter of another integrated circuit device using edges selected from the group consisting of rising and falling edges of the external clock signal.

58. The integrated circuit device of claim 48, further including a memory array, wherein the integrated circuit device is an integrated circuit memory device.

59. The integrated circuit device of claim 48, wherein the integrated circuit device is a memory controller.

60. The integrated circuit device of claim 48, wherein the integrated circuit device is a microprocessor.

61. The integrated circuit device of claim 48, wherein the integrated circuit device is a graphics engine.

62. An integrated circuit device comprising:
receiver means for sampling data from an external signal line in response to a receive clock signal;
first adjustable delay means for generating a first internal clock signal having a delay with respect to a reference clock signal, wherein the delay is controlled by a control signal;
comparing means for comparing the reference clock signal and the first internal clock signal, to generate the control signal based on a phase difference between the first internal clock signal and the reference clock signal; and
second adjustable delay means for generating the receive clock signal by interpolation such that a phase of the receive clock signal with respect to an external clock signal is controlled in response to the control signal.

* * * * *